(12) United States Patent
Lee et al.

(10) Patent No.: US 11,304,293 B2
(45) Date of Patent: Apr. 12, 2022

(54) DISPLAY APPARATUS

(71) Applicant: Samsung Display Co., Ltd., Yongin-Si (KR)

(72) Inventors: Yoo jeong Lee, Seoul (KR); Hyunseop Song, Bucheon-si (KR); Minsoo Kang, Hwaseong-si (KR); Yeong Won Kim, Anyang-si (KR)

(73) Assignee: SAMSUNG DISPLAY CO., LTD., Gyeonggi-do (KR)

( * ) Notice: Subject to any disclaimer, the term of this patent is extended or adjusted under 35 U.S.C. 154(b) by 2 days.

(21) Appl. No.: 16/892,624

(22) Filed: Jun. 4, 2020

(65) Prior Publication Data

US 2021/0037639 A1    Feb. 4, 2021

(30) Foreign Application Priority Data

Jul. 29, 2019   (KR) .................. 10-2019-0091575

(51) Int. Cl.
| | |
|---|---|
| *H05K 1/00* | (2006.01) |
| *H05K 1/02* | (2006.01) |
| *H05K 1/11* | (2006.01) |
| *H05K 1/14* | (2006.01) |
| *H05K 3/28* | (2006.01) |
| *H05K 1/18* | (2006.01) |

(52) U.S. Cl.
CPC ............. *H05K 1/028* (2013.01); *H05K 1/111* (2013.01); *H05K 1/147* (2013.01); *H05K 1/181* (2013.01); *H05K 3/284* (2013.01); *H05K 2201/056* (2013.01); *H05K 2201/10128* (2013.01)

(58) Field of Classification Search
CPC ........ H05K 1/028; H05K 1/111; H05K 1/147; H05K 3/284; H05K 1/181; H05K 2201/056; H05K 2201/10128; H05K 3/323; H05K 1/189; H05K 1/116; H05K 1/118; H01L 27/3244; H01L 27/3276; G02F 1/13458; G02F 1/13306
See application file for complete search history.

(56) References Cited

U.S. PATENT DOCUMENTS

| | | | |
|---|---|---|---|
| 7,808,599 B2 | 10/2010 | Nakanishi | |
| 9,769,919 B2* | 9/2017 | Park ................. | H05K 1/147 |
| 2007/0215991 A1* | 9/2007 | Chang .............. | H05K 1/0218 257/668 |
| 2013/0335940 A1* | 12/2013 | Matsui .............. | H01L 24/16 361/783 |
| 2015/0076531 A1* | 3/2015 | Kim ................. | H01L 27/156 257/88 |

(Continued)

FOREIGN PATENT DOCUMENTS

| | | |
|---|---|---|
| JP | 2005338699 A | 12/2005 |
| JP | 5437567 B2 | 3/2014 |
| KR | 100473414 B1 | 3/2005 |

*Primary Examiner* — Yuriy Semenenko
(74) *Attorney, Agent, or Firm* — Cantor Colburn LLP

(57) ABSTRACT

A display apparatus includes a display panel which have first display pads arranged in a first direction, a main circuit board, a first flexible circuit board which includes first substrate pads connected to the main circuit board and the first display pads and a first driving chip connected to the first substrate pads, and is bent in a direction toward a back surface of the display panel, and a protective member disposed on the first flexible circuit board. The protective member covers the first driving chip.

19 Claims, 13 Drawing Sheets

(56) References Cited

U.S. PATENT DOCUMENTS

| | | | | |
|---|---|---|---|---|
| 2018/0068992 A1* | 3/2018 | Oh | ................... | H01L 24/00 |
| 2018/0081399 A1* | 3/2018 | Kwon | ................... | G06F 1/1652 |
| 2019/0319082 A1* | 10/2019 | Nam | ................... | H01L 27/1218 |
| 2020/0069190 A1* | 3/2020 | Ryu | ................... | A61B 5/0008 |

\* cited by examiner

DISPLAY APPARATUS

This application claims priority to Korean Patent Application No. 10-2019-0091575, filed on Jul. 29, 2019, and all the benefits accruing therefrom under 35 U.S.C. § 119, the content of which in its entirety is herein incorporated by reference.

BACKGROUND

The present disclosure herein relates to a display apparatus, and more specifically to, a display apparatus with improved reliability.

A display apparatus connects a circuit board to a display panel after the display panel is manufactured. For example, a tape automated bonding ("TAB") mounting method bonds a circuit board to a display panel using an anisotropic conductive film.

SUMMARY

The present disclosure provides a display apparatus which prevents defects of a circuit board which are generated when the circuit board is bent.

An embodiment of the inventive concept provides a display apparatus including a display panel which includes first display pads arranged in a first direction, a main circuit board, a first flexible circuit board which includes first substrate pads connected to the main circuit board and the first display pads and a first driving chip connected to the first substrate pads, and is bent in a direction toward a back surface of the display panel, and a protective member disposed on the first flexible circuit board, where the protective member covers the first driving chip.

In an embodiment, the first flexible circuit board may include a lower surface from which the first substrate pads are exposed and an upper surface facing the lower surface, where the lower surface faces the back surface of the display panel when the first flexible circuit board is bent.

In an embodiment, the first driving chip may be mounted on the lower surface, and the protective member may cover the first driving chip and a portion of the lower surface.

In an embodiment, the first driving chip may be mounted on the upper surface, and the protective member may cover the first driving chip and a portion of the upper surface.

In an embodiment, the first flexible circuit board may further include a first portion which overlaps at least a portion of the main circuit board, a second portion which overlaps at least a portion of the display panel, and a third portion which connects the first portion and the second portion, where when the first flexible circuit is bent, the third portion may have a relatively greater curvature than each of the first portion and the second portion.

In an embodiment, the first driving chip may be disposed on the first portion, and the protective member may cover the first driving chip.

In an embodiment, the first driving chip may be disposed on the third portion, the protective member may cover the first driving chip.

In an embodiment, the display panel may further include second display pads disposed spaced apart from the first display pads in a second direction crossing the first direction and arranged in the first direction, and the display apparatus may further include a second flexible circuit board which includes second substrate pads connected to the main circuit board and the second display pads and a second driving chip connected to the second substrate pads, and is bent in the direction toward the back surface of the display panel, where a portion of the second flexible circuit board covers a portion of the first flexible circuit board.

In an embodiment, the protective member may be provided in plurality, and one of the protective members may cover the second driving chip.

In an embodiment, the protective member may include a first extension pattern and a second extension pattern which are spaced apart from each other along the first direction and extended along a second direction crossing the first direction, and a connection pattern which connects the first extension pattern and the second extension pattern and is extended along the first direction, where the connection pattern covers the first driving chip.

In an embodiment, each of the first extension pattern and the second extension pattern may be provided in plurality, the plurality of first extension patterns and the plurality of second extension patterns may be alternately disposed along the first direction, the connection pattern may be provided in plurality, and each of the plurality of connection patterns may be disposed between corresponding first extension pattern and corresponding second extension pattern.

In an embodiment, the protective member may be provided as either a resin or a double-sided tape.

An embodiment of the inventive concept provides a display apparatus including a display panel which includes first display pads arranged in a first direction and second display pads disposed spaced apart from the first display pads in a second direction crossing the first direction and arranged in the first direction, a main circuit board, a first flexible circuit board which includes first substrate pads connected to the main circuit board and the first display pads and a first driving chip connected to the first substrate pads, a second flexible circuit board which includes second substrate pads connected to the main circuit board and the second display pads and a second driving chip connected to the second substrate pads, and protective members which includes a first protective member disposed on the first flexible circuit board and a second protective member disposed on the second flexible circuit board, where the first flexible circuit board and the second flexible circuit board are bent in a direction toward a back surface of the display panel, and the first protective member covers the first driving chip and the second protective member covers the second driving chip.

In an embodiment, each of the first flexible circuit board and the second flexible circuit board may include a lower surface and an upper surface facing the lower surface, where the lower surface faces the back surface of the display panel when the first flexible circuit board and the second flexible circuit board are bent.

In an embodiment, the first driving chip and the second driving chip may be mounted on the lower surface of the first flexible circuit board and the lower surface of the second flexible circuit board, respectively, the first protective member may cover the first driving chip and a portion of the lower surface of the first flexible circuit board, and the second protective member may cover the second driving chip and a portion of the lower surface of the second flexible circuit board.

In an embodiment, each of the first flexible circuit board and the second flexible circuit board may further include a first portion which overlaps at least a portion of the main circuit board, a second portion which overlaps at least a portion of the display panel, and a third portion which connects the first portion and the second portion, wherein when the first flexible circuit board and the second flexible circuit board are bent, the third portion has a relatively greater curvature than each of the first portion and the second portion.

In an embodiment, the first driving chip may be disposed in the first portion of the first flexible circuit board, and the first protective member may cover the first driving chip, and the second driving chip may be disposed in the first portion of the second flexible circuit board, and the second protective member covers the second driving chip.

In an embodiment, the first driving chip may be disposed in the third portion of the first flexible circuit board, and the first protective member may cover the first driving chip, and the second driving chip may be disposed in the third portion of the second flexible circuit board, and the second protective member covers the second driving chip.

In an embodiment, a sum of widths of the first portion, the second portion, and the third portion of the first flexible circuit board in the second direction may be smaller than a sum of widths of the first portion, the second portion, and the third portion of the second flexible circuit board in the second direction.

In an embodiment, each of the first flexible circuit board and the second flexible circuit board may further include an insulation layer, a plurality of substrate signal lines disposed on the insulation layer, a solder resist layer which defines an opening which exposes at least one of the substrate signal lines, and a plurality of substrate pads connected to the at least one of the substrate signal lines exposed through the opening, where each of the substrate pads is connected to corresponding one of the first display pads and the second display pads by an anisotropic conductive film.

BRIEF DESCRIPTION OF THE FIGURES

The accompanying drawings are included to provide a further understanding of the inventive concept, and are incorporated in and constitute a part of this specification. The drawings illustrate embodiments of the inventive concept and, together with the description, serve to explain principles of the inventive concept. In the drawings.

DETAILED DESCRIPTION

Figure 1A:
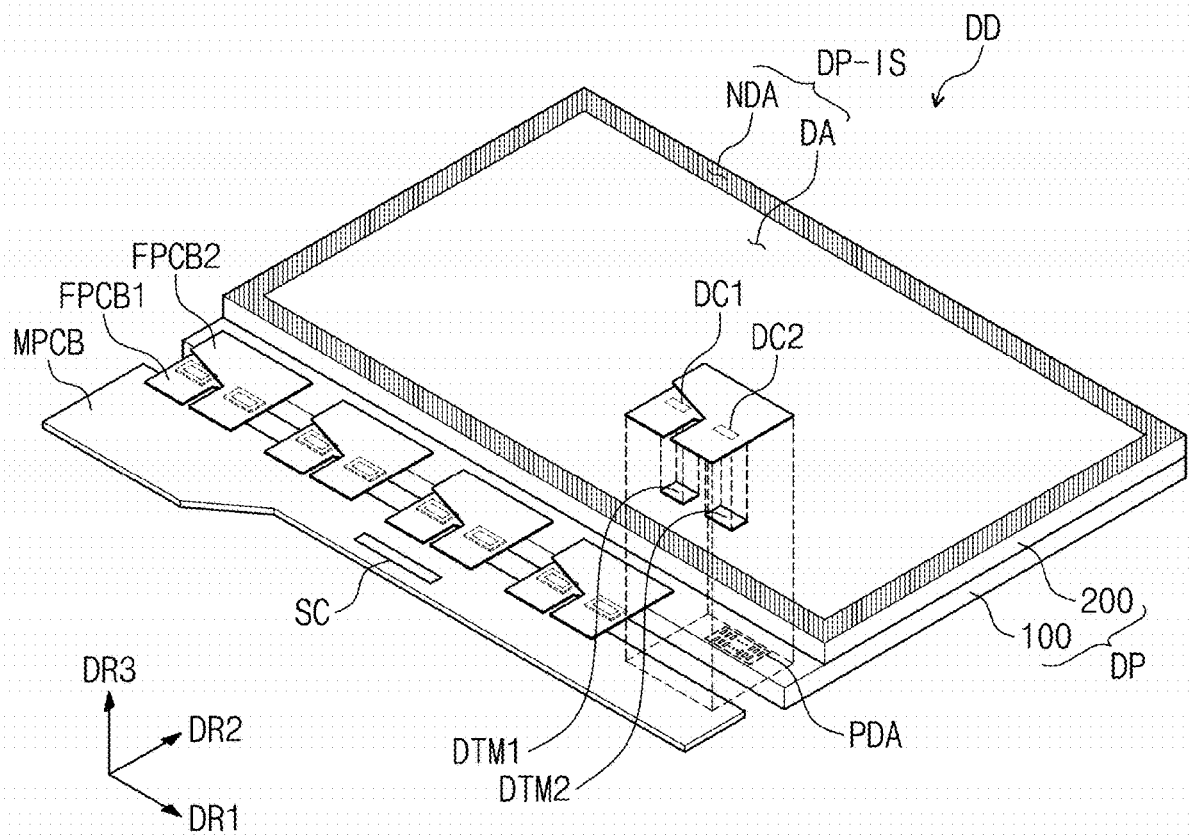
FIG. 1A is a perspective view of a display apparatus according to an embodiment of the inventive concept.

In the present disclosure, when an element (or a region, a layer, a portion, etc.) is referred to as being "on," "connected to," or "coupled to" another element, it means that the element may be directly disposed on/connected to/coupled to the other element, or that a third element may be disposed therebetween.

Like reference numerals refer to like elements. Also, in the drawings, the thickness, the ratio, and the dimensions of elements are exaggerated for an effective description of technical contents.

The term "and/or," includes all combinations of one or more of which associated configurations may define.

It will be understood that, although the terms "first", "second", etc. may be used herein to describe various elements, these elements should not be limited by these terms. These terms are only used to distinguish one element from another. For example, a first element could be termed a second element, and, similarly, a second element could be termed a first element, without departing from the scope of embodiments of the inventive concept. The terms of a singular form may include plural forms unless the context clearly indicates otherwise.

In addition, terms such as "below," "lower," "above," "upper," and the like are used to describe the relationship of the configurations shown in the drawings. The terms are used as a relative concept and are described with reference to the direction indicated in the drawings.

Unless otherwise defined, all terms (including technical and scientific terms) used herein have the same meaning as commonly understood by those skilled in the art to which the inventive concept belongs. It is also to be understood that terms defined in commonly used dictionaries should be interpreted as having meanings consistent with the meanings in the context of the related art, and are expressly defined herein unless they are interpreted in an ideal or overly formal sense.

It should be understood that the terms "comprise", or "have" are intended to specify the presence of stated features, integers, steps, operations, elements, components, or combinations thereof in the disclosure, but do not preclude the presence or addition of one or more other features, integers, steps, operations, elements, components, or combinations thereof. Hereinafter, embodiments of the inventive concept will be described with reference to the accompanying drawings.

Figure 1B:
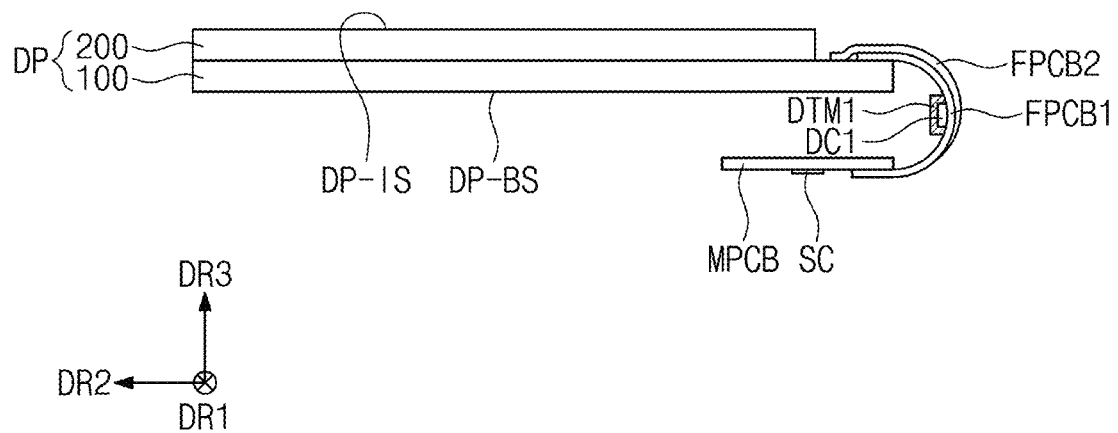
FIG. 1B is a perspective view illustrating a circuit board included in the display apparatus of FIG. 1A in the state of being bent.
Figure 2:
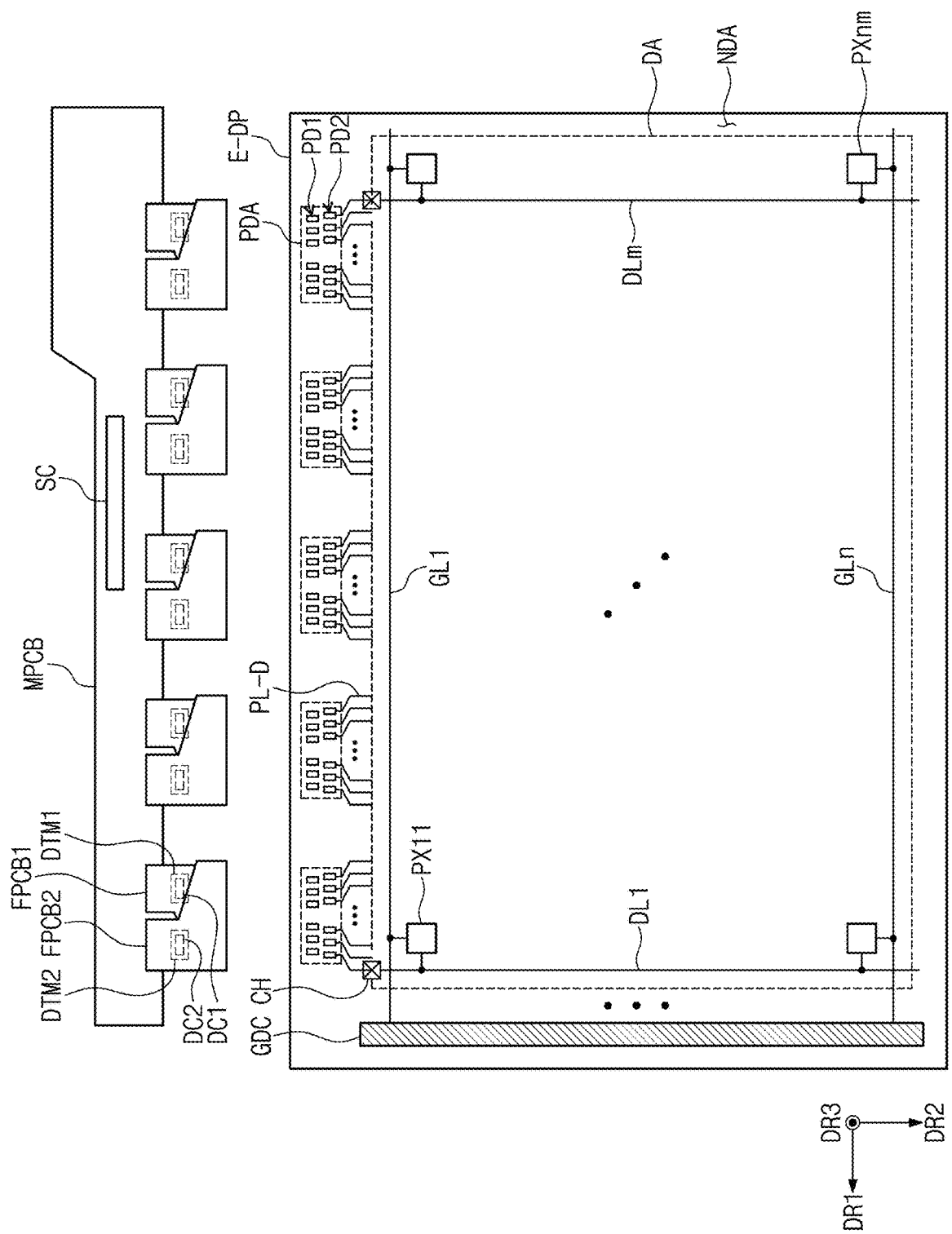
FIG. 2 is a plan view of a display apparatus according to an embodiment of the inventive concept.
Figure 3A:
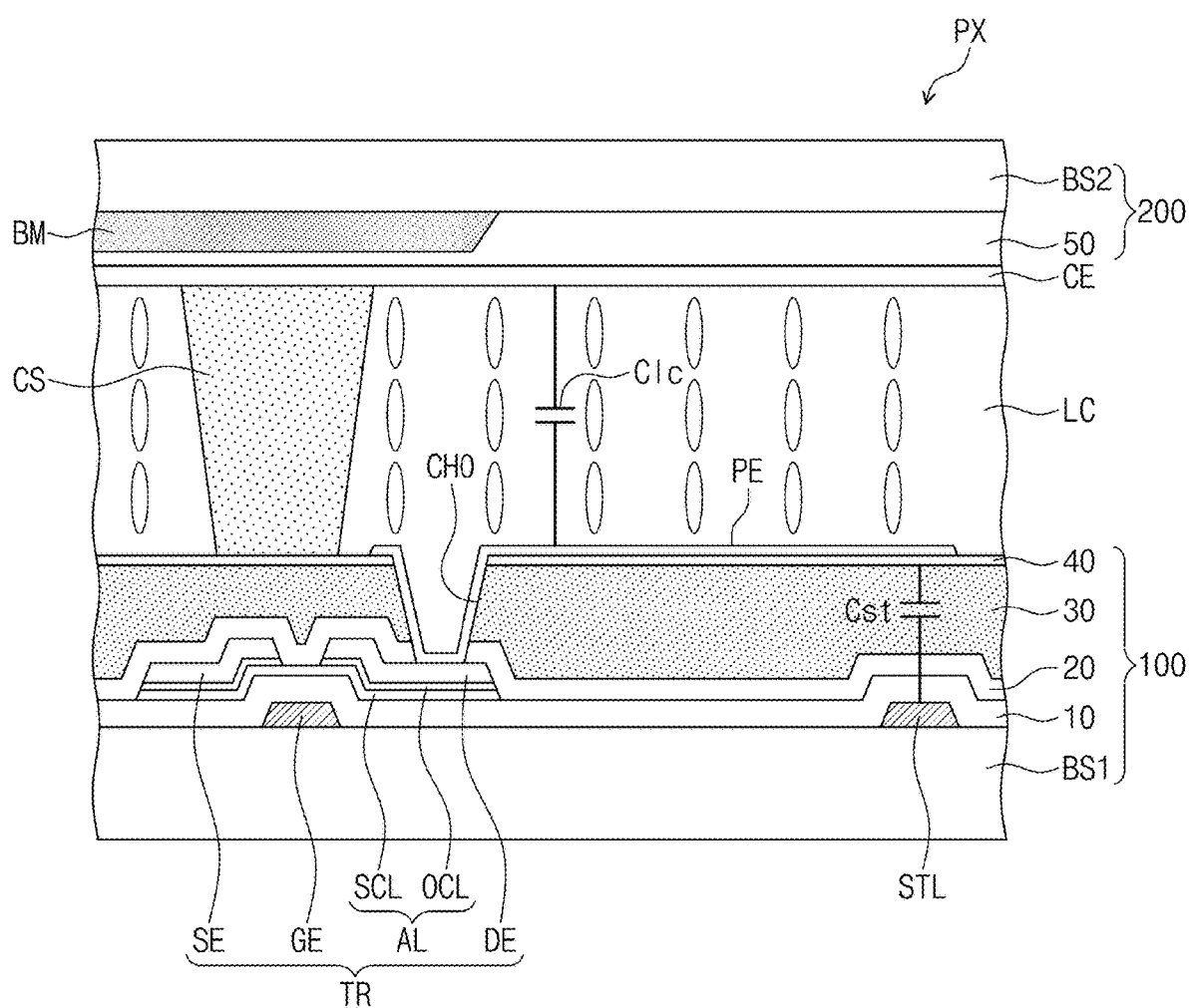
FIG. 3A and FIG. 3B are cross-sectional views of a display region of a display panel according to an embodiment of the inventive concept.
Figure 3B:
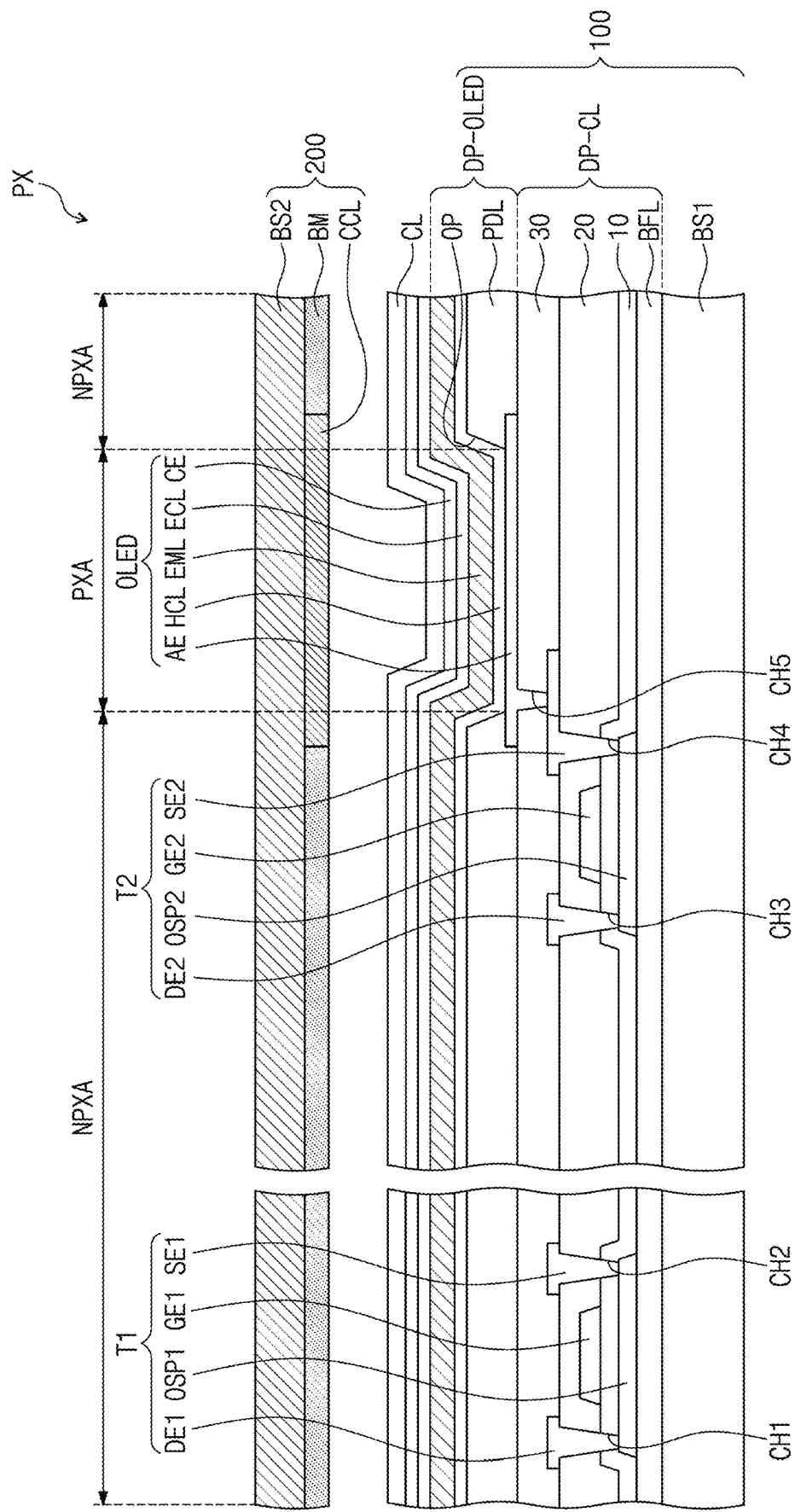

FIG. 1A is a perspective view of a display apparatus according to an embodiment of the inventive concept. FIG. 1B is a perspective view illustrating a circuit board included in the display apparatus of FIG. 1A in the state of being bent. FIG. 2 is a plan view of a display apparatus according to an embodiment of the inventive concept. FIG. 3A and FIG. 3B are cross-sectional views of a display region of a display panel according to an embodiment of the inventive concept.

Referring to FIG. 1A to FIG. 2, a display apparatus DD includes a display panel DP, flexible circuit boards FPCB1 and FPCB2, a main circuit board MPCB, and protective members DTM1 and DTM2.

Although not separately illustrated, the display apparatus DD may further include a receiving member, and may even further include a backlight unit depending on the type of the display panel DP.

The display panel DP may be any one of a liquid crystal display panel, a plasma display panel, an electrophoretic display panel, a microelectromechanical system ("MEMS") display panel, an electrowetting display panel, and an organic light emitting display panel. However, the invention is not particularly limited thereto.

The display panel DP may include a first display substrate 100 and a second display substrate 200. The second display substrate 200 may be disposed on the first display substrate 100. Between the first display substrate 100 and the second display substrate 200, a gray scale display layer for generating an image may be disposed. The gray scale display layer may include any one of a liquid crystal layer, an organic light emitting layer, and an electrophoretic layer depending on the type of the display panel DP.

As shown in FIG. 1A, the display panel DP may display an image through a display surface DP-IS. The display surface DP-IS is parallel to a plane defined by a first direction axis DR1 and a second direction axis DR2. The display surface DP-IS may include a display region DA and a non-display region NDA. The non-display region NDA is defined along the edge of the display surface DP-IS. The display region DA may be surrounded by the non-display region NDA. In an embodiment of the inventive concept, the non-display region NDA may be disposed only in a region of one side of the display region DA adjacent to the flexible circuit boards FPCB1 and FPCB2.

The normal direction of the display surface DP-IS, that is, the thickness direction of the display panel DP is indicated by a third direction axis DR3. A front surface (or an upper surface) and a back surface (or a lower surface) of each component described below are distinguished by the third direction axis DR3. However, the first to third direction axes DR1, DR2, and DR3 shown in the present embodiment are merely exemplary. Hereinafter, first to third directions are defined as directions indicated by the first to third direction axes DR1, DR2, and DR3, respectively, and are given the same reference numerals.

In an embodiment of the inventive concept, the display panel DP provided with a planar display surface DP-IS is illustrated, but the inventive concept is not limited thereto. In another embodiment, the display apparatus DD may include a curved display surface or a three-dimensional display surface. The three-dimensional display surface may include a plurality of display regions indicating different directions.

On the main circuit board MPCB, a signal control unit SC may be mounted. The signal control unit SC receives image data and a control signal from an external graphic control unit (not shown). The signal control unit SC may provide a control signal to the display panel DP.

The flexible circuit boards FPCB1 and FPCB2 may be connected to the display panel DP and the main circuit board MPCB respectively by a conductive adhesive member. The conductive adhesive member may include an anisotropic conductive film. Hereinafter, the conductive adhesive member will be described as being an anisotropic conductive film.

In an embodiment, the flexible circuit boards FPCB1 and FPCB2 may be provided in plurality. For example, the flexible circuit boards FPCB1 and FPCB2 may include a first flexible circuit board FPCB1 and a second flexible circuit board FPCB2. Each of the two types of the flexible circuit boards FPCB1 and FPCB2 may be connected to different pad rows disposed in one display pad region PDA. In the present embodiment, the display pad region PDA is illustrated as being disposed on the first display substrate 100, but the inventive concept is not limited thereto. In another embodiment of the inventive concept, the display pad region PDA may be disposed on the second display substrate 200.

The first flexible circuit board FPCB1 may include a first driving chip DC1, and the second flexible circuit board FPCB2 may include a second driving chip DC2. The main circuit board MPCB transmits a signal to the driving chips DC1 and DC2, and the driving chips DC1 and DC2 may transmit a signal to the display panel DP. In an embodiment, each of the driving chips DC1 and DC2 may be a data driving circuit. In an embodiment of the inventive invention, the flexible circuit boards FPCB1 and FPCB2 may transmit a signal received from the signal control unit SC of the main circuit board MPCB to the display panel DP.

The display apparatus DD according to the inventive concept includes the protective members DTM1 and DTM2. The protective members DTM1 and DTM2 may be disposed on the flexible circuit boards FPCB1 and FPCB2, respectively. For example, the protective members DTM1 and DTM2 may include a first protective member DTM1 disposed on the first flexible circuit board FPCB1 and a second protective member DTM2 disposed on the second flexible circuit board FPCB2.

The protective members DTM1 and DTM2 may be disposed as to overlap the driving chips DC1 and DC2 in a plan view. For example, the first protection member DTM1 overlaps the first driving chip DC1 of the first flexible circuit board FPCB1, and may cover the first driving chip DC1. In addition, the second protective member DTM2 overlaps the second driving chip DC2 of the second flexible circuit board FPCB2, and may cover the second driving chip DC2.

The protective members DTM1 and DTM2 according to an embodiment may be provided as either a resin or a double-sided tape.

As shown in FIG. 1B, the flexible circuit boards FPCB1 and FPCB2 may be bent in a direction toward a back surface DP-BS of the display panel DP. In this case, the flexible circuit boards FPCB1 and FPCB2 have a predetermined curvature, and may be bent toward the back surface DP-BS of the display panel DP. The main circuit board MPCB may be connected to the flexible circuit boards FPCB1 and FPCB2 and received in a receiving member, which is not shown, in the state in which the flexible circuit boards FPCB1 and FPCB2 are bent.

In an embodiment, when the flexible circuit boards FPCB1 and FPCB2 are bent, the driving chips DC1 and DC2 may be disposed on the back surface of the flexible circuit boards FPCB1 and FPCB2 respectively so as to be disposed adjacent to the back surface DP-BS of the display panel DP. FIG. 1B exemplarily illustrates the first driving chip DC1 disposed on the back surface of the first flexible circuit board FPCB1 and the first protective member DTM1 which covers the first driving chip DC1.

Figure 1C:
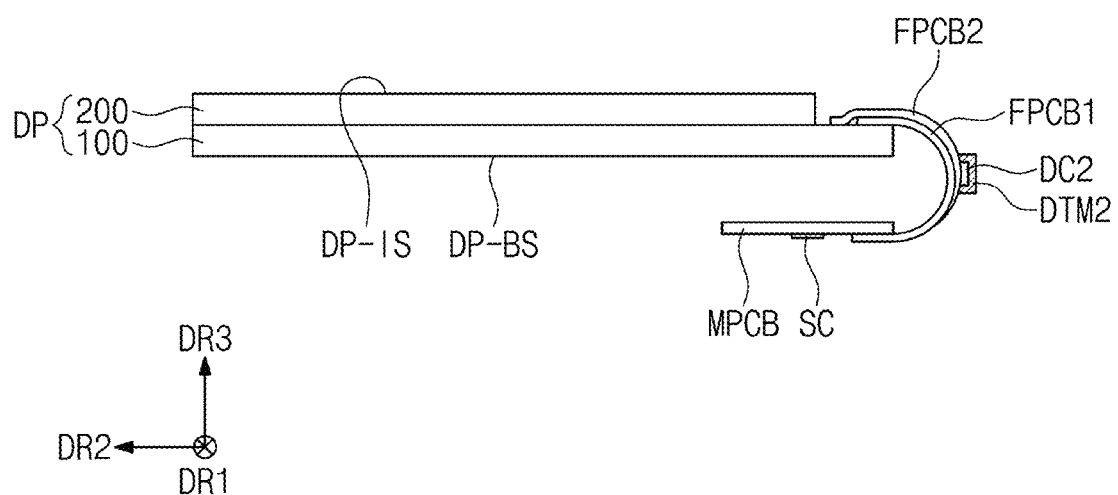
FIG. 1C is a perspective view illustrating a circuit board included in the display apparatus of FIG. 1A in the state of being bent.

In another embodiment, when the flexible circuit boards FPCB1 and FPCB2 are bent, the driving chips DC1 and DC2 may be disposed on the upper surface of the flexible circuit boards FPCB1 and FPCB2, respectively. FIG. 1C exemplarily illustrates the second driving chip DC2 disposed on the upper surface of the second flexible circuit board FPCB2 and the second protective member DTM2 which covers the second driving chip DC2. Although not shown, the inventive concept is not limited thereto. In another embodiment, the driving chips DC1 and DC2 may be disposed on different surfaces of the flexible circuit boards FPCB1 and FPCB2. For example, any one of the driving chips DC1 and DC2 may be disposed on the upper surface of the corresponding flexible circuit board of the flexible circuit boards FPCB1 and FPCB2, and the other of the driving chips DC1 and DC2 may be disposed on the back surface of the corresponding flexible circuit board of the flexible circuit boards FPCB1 and FPCB2. In this case, the protective members DTM1 and DTM2 may cover the driving chips DC1 and DC2, respectively.

At this time, due to tensile and/or compressive stresses caused by the bending of the flexible circuit boards FPCB1 and FPCB2, the driving chips DC1 and DC2 may be separated from the flexible circuit boards FPCB1 and FPCB2, or may be damaged by external impact or damaged by foreign matters inflow in a case without the protective members DTM1 and DTM2.

According to the inventive concept, since the protective members DTM1 and DTM2 for covering the driving chips DC1 and DC2 are included, damage to the driving chips DC1 and DC2 caused by tensile and/or compressive stresses occurring when the flexible circuit boards FPCB1 and FPCB2 are bent may be prevented. In addition, the external impact may be mitigated, and foreign matters may be prevented from entering. Accordingly, the display apparatus DD with improved reliability may be provided.

FIG. 2 illustrates the planar arrangement relationship of signal lines GL1 to GLn, DL1 to DLm, and PL-D, and pixels PX11 to PXnm. The signal lines GL1 to GLn, DL1 to DLm, and PL-D may include a plurality of gate lines GL1 to GLn, a plurality of data lines DL1 to DLm, and auxiliary signal lines PL-D.

The plurality of gate lines GL1 to GLn is extended in a first direction DR1, and arranged along a second direction DR2. The plurality of data lines DL1 to DLm and the plurality of gate lines GL1 to GLn are insulated from each other while crossing each other. The plurality of data lines DL1 to DLm is extended in the second direction DR2, and arranged along the first direction DR1.

The plurality of gate lines GL1 to GLn and the plurality of data lines DL1 to DLm are disposed to overlap the display region DA. The auxiliary signal lines PL-D are disposed to overlap the non-display region NDA and are connected to the plurality of data lines DL1 to DLm.

The auxiliary signal lines PL-D may be disposed on a different layer from a layer on which the plurality of data lines DL1 to DLm are disposed. Through a contact-hole CH, the data lines DL1 to DLm may be electrically connected to the corresponding auxiliary signal lines PL-D, respectively. The contact-hole CH passes through at least one insulation layer disposed between the data lines DL1 to DLm and the auxiliary signal lines PL-D. FIG. 2 exemplarily illustrates two contact-holes CH.

In another embodiment of the inventive concept, the contact-hole CH may be omitted. The data lines DL1 to DLm and the auxiliary signal lines PL-D may be disposed on the same layer. In this case, one data line and one auxiliary signal line connected to each other may be defined as one signal line. In this case, the data line and the auxiliary signal line connected to each other may be defined as different portions of the one signal line.

Each of the pixels PX11 to PXnm is connected to a corresponding gate line among the plurality of gate lines GL1 to GLn and a corresponding data line among the plurality of data lines DL1 to DLm. Each of the pixels PX11 to PXnm may include a pixel driving circuit and a display element.

FIG. 2 exemplarily illustrates the pixels PX11 to PXnm in a matrix form, but the inventive concept is not limited thereto. The pixels PX11 to PXnm may be disposed in a pentile form. For example, points at which the pixels PX11 to PXnm are disposed may correspond to vertices of a diamond.

As shown in FIG. 2, in each display pad region PDA, two display pad rows PD1 and PD2 are disposed. Each of the two display pad rows PD1 and PD2 includes a plurality of substrate pads arranged in the first direction DR1.

A first display pad row PD1 and a second display pad row PD2 are disposed spaced apart in the second direction DR2. In the second direction DR2, the second display pad row PD2 is disposed spaced farther apart from an edge E-DP of the display panel DP than the first display pad row DP1, and disposed more adjacent to the display region DA. Pads of the first display pad row PD1 and the second display pad row PD2 are each connected to the auxiliary signal lines PL-D.

A gate driving circuit GDC may be integrated into the display panel DP through an oxide silicon gate driver circuit ("OSG") process or an amorphous silicon gate driver circuit ("ASG") process.

FIG. 3A and FIG. 3B are cross-sectional views of the display region DA of the display panel DP according to an embodiment of the inventive concept. FIG. 3A illustrates a cross-section corresponding to a pixel PX of a liquid crystal display panel, and FIG. 3B illustrates a cross-section corresponding to the pixel PX of an organic light emitting display panel.

Referring to FIG. 3A, the gray scale display layer of the display panel DP according to an embodiment of the inventive concept may be a liquid crystal layer LC. Accordingly, the display panel DP may be a liquid crystal display panel. The pixel PX of the liquid crystal display panel may include a transistor TR, a liquid crystal capacitor Clc, and a storage capacitor Cst.

The transistor TR includes a control electrode GE connected to a gate line, an activation unit AL overlapping the control electrode GE, an input electrode SE connected to a data line, and an output electrode DE disposed spaced apart from the input electrode SE. The liquid crystal capacitor Clc includes a pixel electrode PE and a common electrode CE. The storage capacitor Cst includes the pixel electrode PE and a portion of a storage line STL overlapping the pixel electrode PE.

On one surface of a first base substrate BS1, the control electrode GE and the storage line STL are disposed. The first base substrate BS1 may be any one of a glass substrate, a plastic substrate, and a substrate containing polyimide ("PI"). On one surface of the first base substrate BS1, a first insulation layer 10 covering the control electrode GE and the storage line STL is disposed. The first insulation layer 10 may include at least one of an inorganic material or an organic material.

On the first insulation layer 10, the activation unit AL overlapping the control electrode GE is disposed. The activation unit AL may include a semiconductor layer SCL and an ohmic contact layer OCL. On the first insulation layer 10, the semiconductor layer SCL is disposed, and on the semiconductor layer SCL, the ohmic contact layer OCL is disposed.

The semiconductor layer SCL may include amorphous silicon or crystalline silicon. In addition, the semiconductor layer SCL may include a metal oxide semiconductor. The ohmic contact layer OCL may include a dopant doped at a higher density than the semiconductor layer SCL. The ohmic contact layer OCL may include two portions spaced apart from each other. In an embodiment of the inventive concept, the ohmic contact layer OCL may have a single-body shape. However, the inventive concept is not limited thereto. Depending on the type of the semiconductor layer SCL, the ohmic contact layer OCL may be omitted, and is not limited to any one embodiment.

On the activation unit AL, the output electrode DE and the input electrode SE are disposed. The output electrode DE and the input electrode SE are disposed spaced apart from each other. On the first insulation layer 10, a second insulation layer 20 covering the activation unit AL, the output electrode DE, and the input electrode SE is disposed. On the second insulation layer 20, a third insulation layer 30 is disposed. The second insulation layer 20 and the third insulation layer 30 may include at least one of an inorganic material or an organic material. On the second insulation layer 20, the third insulation layer 30 is disposed. The third insulation layer 30 may an organic layer of a single layer which provides a flat surface. In an embodiment, the third insulation layer 30 may include a plurality of color filters. On the third insulation layer 30, a fourth insulation layer 40 is disposed. The fourth insulation layer 40 may be an inorganic layer covering the color filters.

As shown in FIG. 3A, on the fourth insulation layer 40, the pixel electrode PE is disposed. The pixel electrode PE is connected to the output electrode DE through a through-hole CH0 passing through the second insulation layer 20, the third insulation layer 30, and the fourth insulation layer 40. On the fourth insulation layer 40, an alignment film (not shown) covering the pixel electrode PE may be disposed.

A second base substrate BS2 may be any one of a glass substrate, a plastic substrate, and a substrate containing polyimide (PI). On a lower surface of the second base substrate BS2, a black matrix layer BM is disposed. That is, on the black matrix layer BM, openings corresponding to pixel regions may be defined. A spacer CS may be disposed to overlap the black matrix layer BM.

On a lower surface of the second base substrate BS2, insulation layers covering the black matrix layer BM are disposed. FIG. 3A exemplarily illustrates a fifth insulation layer 50 providing a flat surface. The fifth insulation layer 50 may include an organic matter.

On a lower surface of the second base substrate BS2, the common electrode CE is disposed. On the common electrode CE, an alignment film (not shown) may be disposed.

The common electrode CE according to an embodiment may include a transmissive metal such as a transparent conductive oxide ("TCO").

A common voltage is applied to the common electrode CE. The common voltage may have a different value from a pixel voltage, or may have the same value. In a liquid crystal display panel in a vertical alignment ("VA") mode, when a common voltage and a pixel voltage have the same value, the potential difference is zero, and in this case, a black-colored screen may be displayed in the display region DA (see FIG. 1).

The cross-section of the pixel PX shown in FIG. 3A is only exemplary. In another embodiment, the first display substrate 100 and the second display substrate 200 may be reversed in a third direction DR3. The color filters may be disposed on the second display substrate 200.

In FIG. 3A, a liquid crystal display panel in a vertical alignment mode has been exemplarily described. However, in another embodiment of the inventive concept, any one mode among an In-Plane Switching ("IPS") mode, a Fringe-Field Switching ("FFS") mode, and a Plane to Line Switching ("PLS") mode may be applied, and the liquid crystal display panel is not limited to any one specific mode.

Referring to FIG. 3B, the gray scale display layer of the display panel DP according to an embodiment of the inventive concept may include an organic light emitting layer EML. Accordingly, the display panel DP may be an organic light emitting display panel. The pixel PX of an organic light emitting display panel may include a switching transistor T1, a driving transistor T2, and a light emitting diode OLED.

The organic light emitting display panel includes a display substrate 100 and an encapsulation substrate 200. The display substrate 100 includes the first base substrate BS1, a circuit element layer DP-CL disposed on the first base substrate BS1, a display element layer DP-OLED disposed on the circuit element layer DP-CL, and a cover layer CL disposed on the display element layer DP-OLED. The encapsulation substrate 200 may include the second base substrate BS2, the black matrix layer BM disposed on the second base substrate BS2, and a color conversion layer CCL.

The first base substrate BS1 may be any one of a glass substrate, a plastic substrate, and a substrate containing polyimide (PI). The circuit element layer DP-CL includes at least one insulation layer and a circuit element. The circuit element includes a signal line and a driving circuit of a pixel, and the like. The circuit element layer DP-CL may be formed through a forming process of an insulation layer, a semiconductor layer, and a conductive layer by coating, deposition, and the like, and a patterning process of an insulation layer, a semiconductor layer, and a conductive layer by a photolithography process.

In an embodiment, the circuit element layer DP-CL may include a buffer film BFL, the first insulation layer 10, the second insulation layer 20, and the third insulation layer 30. The first insulation layer 10 and the second insulation layer 20 may each be an inorganic film and the third insulation layer 30 may be an organic film.

FIG. 3B exemplarily illustrates the arrangement relationship of a first semiconductor pattern OSP1, a second semiconductor pattern OSP2, a first control electrode GE1, a second control electrode GE2, a first input electrode DE1, a first output electrode SE1, a second input electrode DE2, a second output electrode SE2 all constituting the switching transistor T1 and the driving transistor T2. First, second, third, and fourth through-holes CH1, CH2, CH3, and CH4 are also exemplarily illustrated.

The display element layer DP-OLED includes the light emitting diode OLED. The display element layer DP-OLED may include an organic light emitting diode as the light emitting diode OLED. The display element layer DP-OLED includes a pixel definition film PDL. For example, the pixel definition film PDL may be an organic layer.

On an intermediate organic film 30, a first electrode AE is disposed. The first electrode AE is connected to the second output electrode SE2 through a fifth through-hole CH5 passing through an intermediate organic film 30. On the pixel definition film PDL, an opening OP is defined. The opening OP of the pixel definition film PDL exposes at least a portion of the first electrode AE. The opening OP of the pixel definition film PDL is named as a light emitting opening to be distinguished from other openings.

As shown in FIG. 3B, the display panel DP may include a light emitting region PXA and a non-light emitting region NPXA adjacent to the light emitting region PXA. The non-light emitting area NPXA may surround the light emitting region PXA. In an embodiment, the light emitting region PXA is defined to correspond to a certain region of the first electrode AE exposed by the light emitting opening OP.

A hole control layer HCL may be commonly disposed in the light emitting region PXA and the non-light emitting region NPXA. The hole control layer HCL includes a hole transport layer, and may further include a hole injection layer. On the hole control layer HCL, the light emitting layer EML is disposed. The organic light emitting layer EML may be commonly disposed in the light emitting region PXA and the non-light emitting region NPXA. However, the inventive concept is not limited thereto. In another embodiment, the organic light emitting layer EML may be disposed in the light emitting region PXA, and may not be disposed in the non-light emitting region NPXA. The organic light emitting layer EML may include an organic matter and/or an inorganic matter. The organic light emitting layer EML may generate predetermined light, for example, blue light.

On the organic light emitting layer EML, an electron control layer ECL is disposed. The electron control layer ECL includes an electron transport layer, and may further include an electron injection layer. The hole control layer HCL and the electron control layer ECL may be commonly formed in a plurality of pixels using an open mask. On the electron control layer ECL, a second electrode CE is disposed. The second electrode CE is commonly disposed in the plurality of pixels. On the second electrode CE, the cover layer CL protecting the second electrode CE may be disposed. The cover layer CL may include an organic matter or an inorganic matter.

The second base substrate BS2 is disposed spaced apart from the cover layer CL. The second base substrate BS2 may be any one of a glass substrate, a plastic substrate, and a substrate containing polyimide (PI). Depending on the pixel PX, the color conversion layer CCL may transmit a first color light, or may convert the first color light to a second color light or a third color light. The color conversion layer CCL may include a quantum dot.

In an embodiment of the inventive concept, the encapsulation substrate 200 may be substituted with a thin film encapsulation layer including a plurality of inorganic layers and an organic layer sealed by the inorganic layers. In this case, the black matrix layer BM and the color conversion layer CCL may be disposed on the thin film encapsulation layer.

Figure 4A:
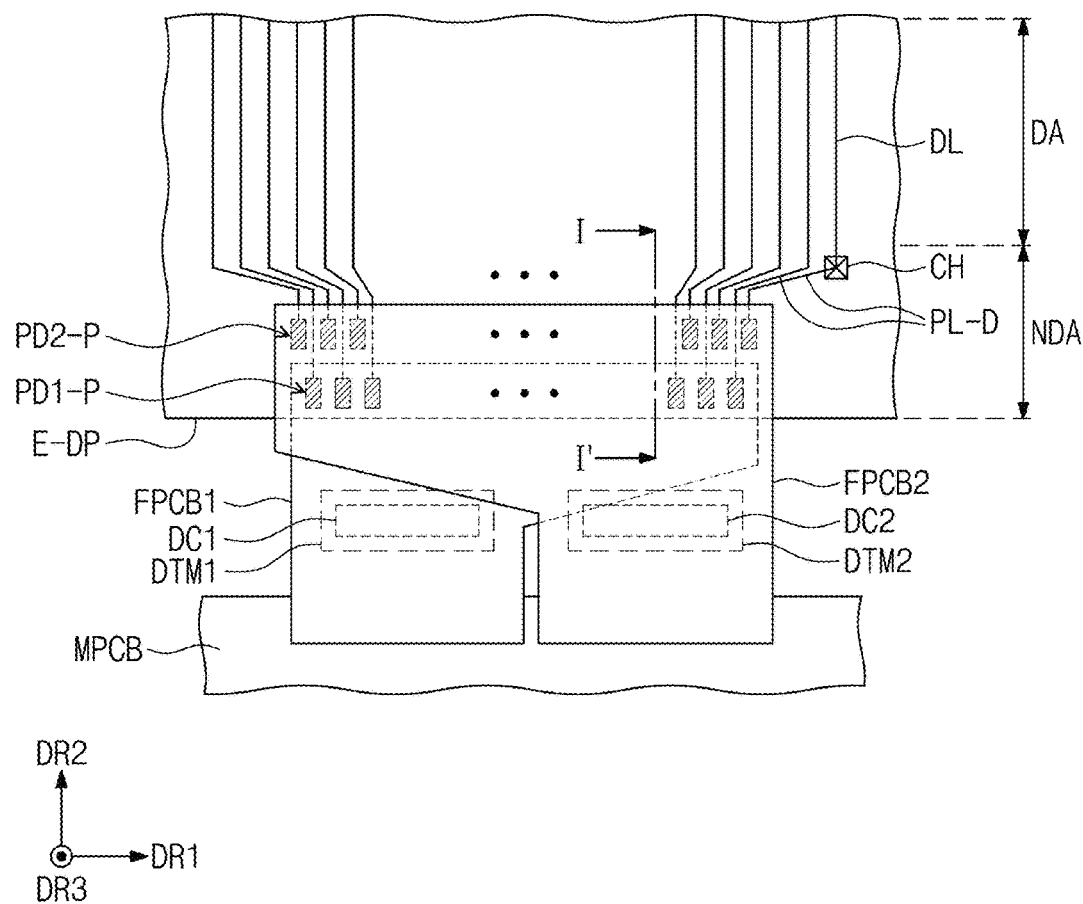
FIG. 4A is an enlarged plan view of a portion of a display apparatus according to an embodiment of the inventive concept.
Figure 4B:
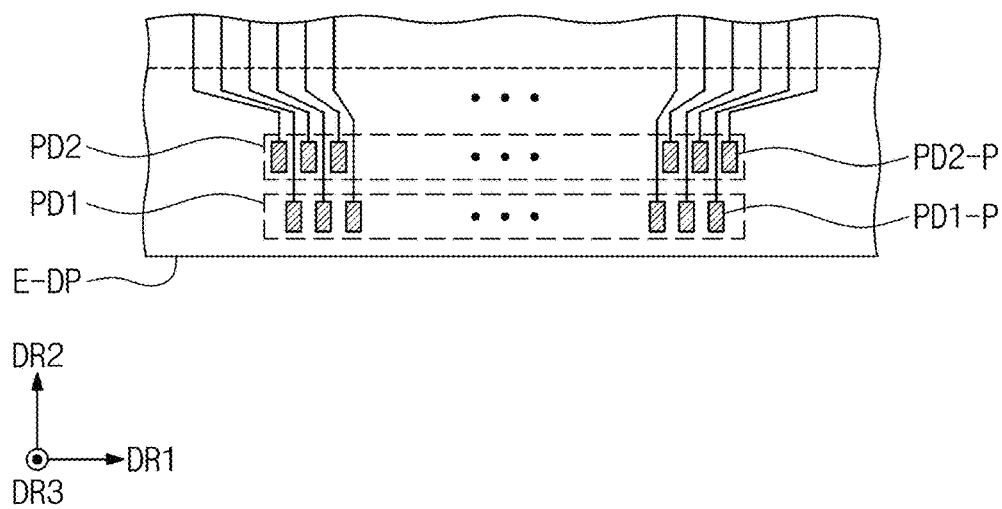
FIG. 4B is an enlarged plan view of a portion of a display panel according to an embodiment of the inventive concept.
Figure 5A:
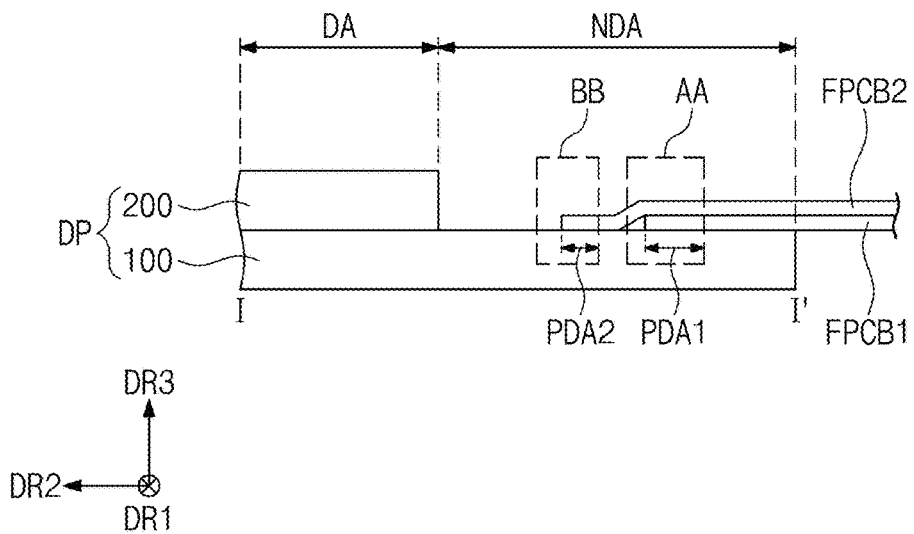
FIG. 5A is a cross-sectional view taken along line I-I' of FIG. 4A.
Figure 5B:
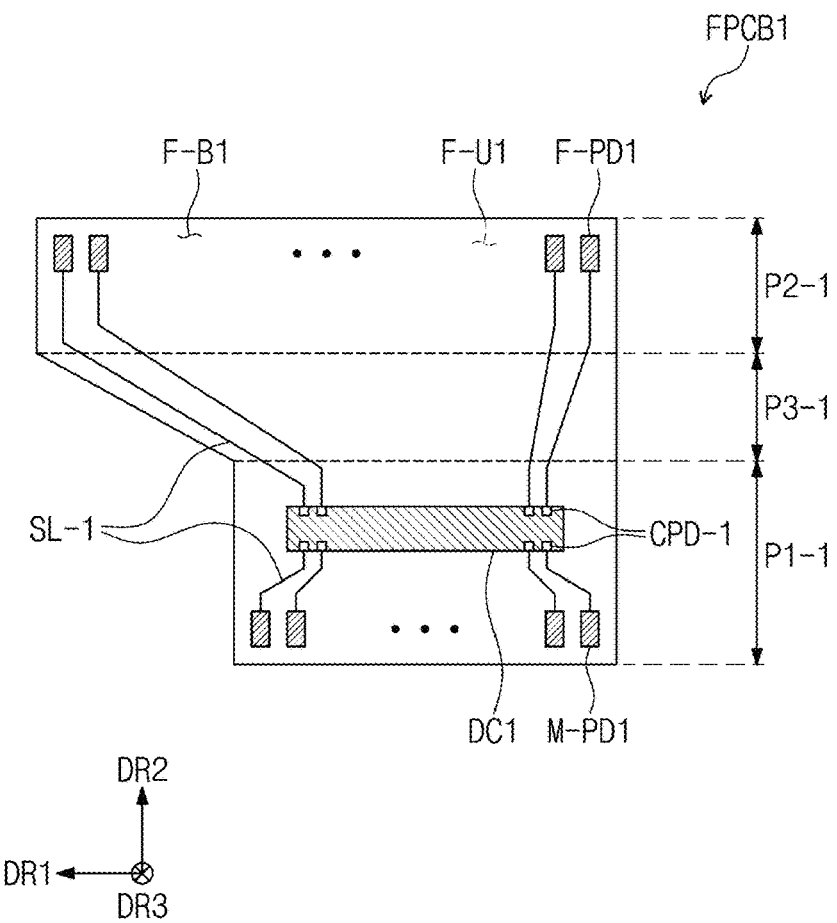
FIG. 5B and FIG. 5C are bottom views of a flexible circuit board according to an embodiment of the inventive concept.
Figure 5C:
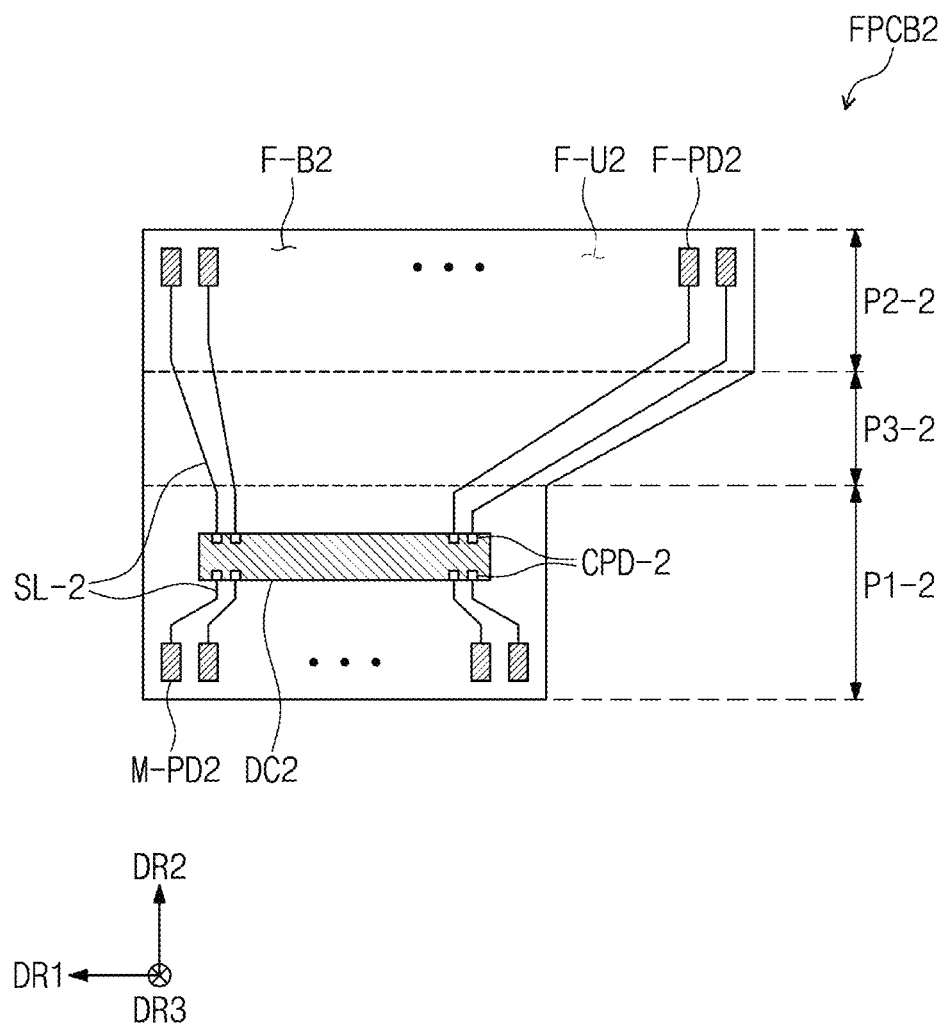
Figure 6A:
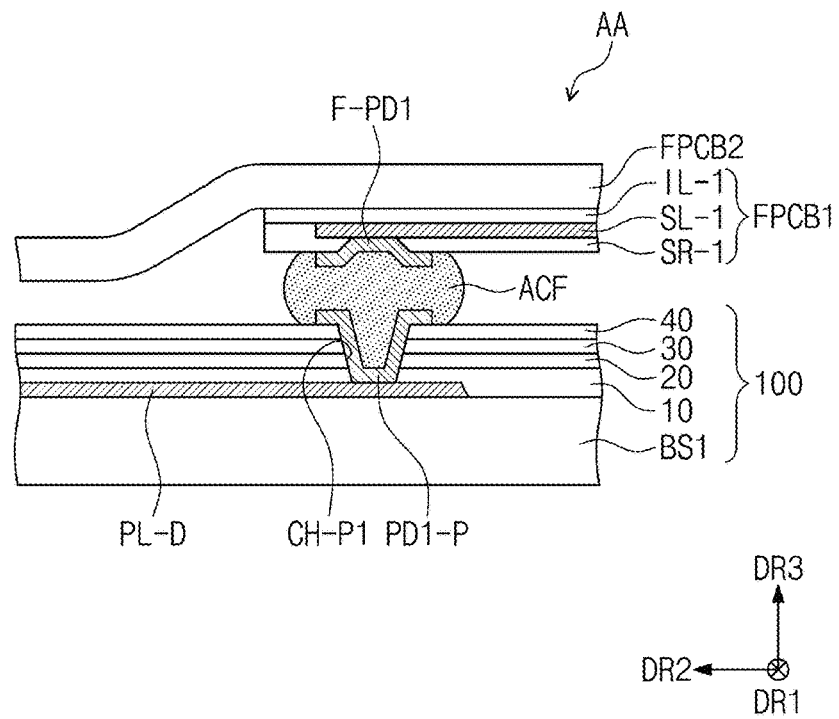
FIG. 6A is an enlarged cross-sectional view of region AA of FIG. 5A.
Figure 6B:
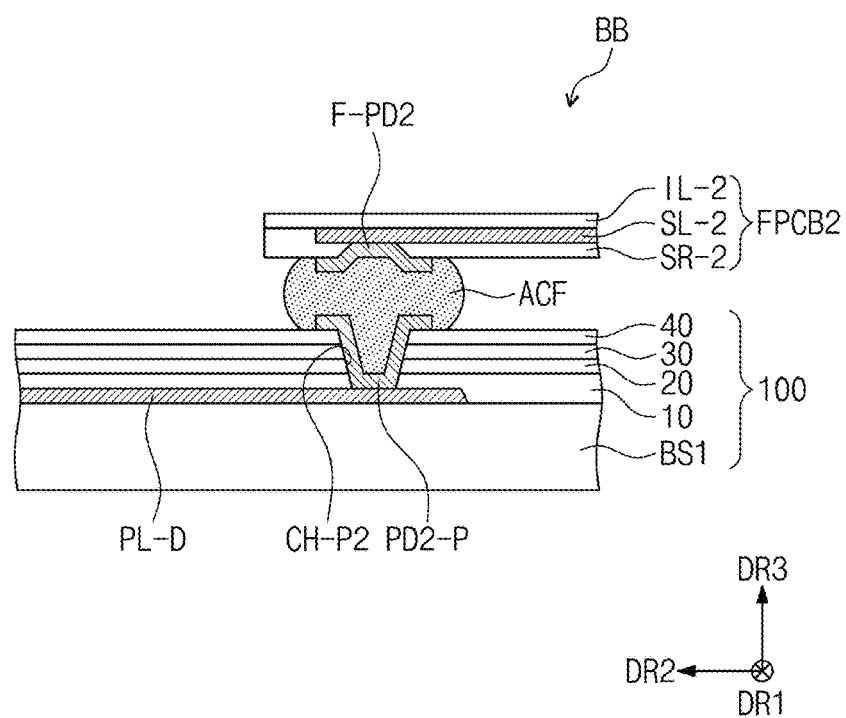
FIG. 6B is an enlarged cross-sectional view of region BB of FIG. 5A.

FIG. 4A is an enlarged plan view of a portion of a display apparatus according to an embodiment of the inventive concept. FIG. 4B is an enlarged plan view of a portion of a display panel according to an embodiment of the inventive concept. FIG. 5A is a cross-sectional view taken along line I-I' of FIG. 4A. FIG. 5B and FIG. 5C are bottom views of a flexible circuit board according to an embodiment of the inventive concept. FIG. 6A is an enlarged cross-sectional view of region AA of FIG. 5A. FIG. 6B is an enlarged cross-sectional view of region BB of FIG. 5A. The same reference numerals are used for the same/similar components as those of FIG. 1 and FIG. 2, and redundant descriptions thereof are omitted.

Referring to FIG. 4A and FIG. 4B, in the display pad region PDA (see FIG. 1A), the first display pad row PD1 and the second display pad row PD2 forming different rows are disposed. The first display pad row PD1 includes a plurality of first display pads PD1-P, and the second display pad row PD2 includes a plurality of second display pads PD2-P.

The first display pads PD1-P are arranged spaced apart from each other along the first direction DR1. The second display pads PD2-2 are disposed spaced apart from the first display pads PD1-P along the second direction DR2, and arranged spaced apart from each other along the first direction DR1. The first display pads PD1-P are disposed more adjacent to the edge E-DP of the display panel DP than the second display pads PD2-P.

When viewed from the edge E-DP, one second display pad PD2-P may be seen between two adjacent first display pads PD1-P. Accordingly, when viewed from the edge E-DP, the first display pads PD1-P and the second display pads PD2-P may be alternately disposed.

The first flexible circuit board FPCB1 may include substrate pads F-PD1 and M-PD1 (see FIG. 5B) corresponding to the first display pads PD1-P, and the second flexible circuit board FPCB2 may include substrate pads F-PD2 and M-PD2 (see FIG. 5C) corresponding to the second display pads PD2-P.

For example, first output pads F-PD1 of the first flexible circuit board FPCB1 are electrically connected to the first display pads PD1-P, and second output pads F-PD2 of the second flexible circuit board FPCB2 are electrically connected to the second display pads PD2-P.

Since the flexible circuit boards FPCB1 and FPCB2 are connected to the display pad rows PD1 and PD2 which are spaced apart from each other in the second direction DR2, respectively, widths in the second direction DR2 of the flexible circuit boards FPCB1 and FPCB2 may be different from each other. For example, the width of the second flexible circuit board FPCB2 in the second direction DR2 may be greater than the width of the first flexible circuit board FPCB1 in the second direction DR2. Accordingly, a portion of the second flexible circuit board FPCB2 according to an embodiment may cover a portion of the first flexible circuit board FPCB1.

According to the inventive concept, since the flexible circuit boards FPCB1 and FPCB2 connected to the display pad rows PD1 and PD2 spaced apart from each other along the second direction DR2, respectively, and partially overlapping each other are included, the area of the non-display region NDA on which the display pads PD1-P and PD2-P are disposed is reduced, so that the display apparatus DD having a narrow bezel may be provided.

FIG. 5A schematically illustrates the relationship between the first flexible circuit board FPCB1 and the second flexible circuit board FPCB2 connected to the display panel DP. Pads included in each of the display panel DP, the first flexible circuit board FPCB1, and the second flexible circuit board FPCB2 are omitted.

A portion of the second flexible circuit board FPCB2 according to an embodiment covers a portion of the first flexible circuit board FPCB1. That is, the second flexible circuit board FPCB2 covers a side of the first flexible circuit board FPCB1 facing the display region DA.

Referring to FIG. 5B and FIG. 5C, the first flexible circuit board FPCB1 according to an embodiment includes a first upper surface F-U1 and a first lower surface F-B1 facing the first upper surface F-U1. The first upper surface F-U1 is shown in the plan view, and the first lower surface F-B1 is shown in the bottom view. The first flexible circuit board FPCB1 includes first substrate signal lines SL-1, a first driving chip DC1 disposed on the first lower surface F-B1, and a plurality of first substrate pads F-PD1, M-PD1, and CPD-1 exposed from the first lower surface F-B1.

The first substrate pads F-PD1, M-PD1, and CPD-1 may include first connection pads CPD-1 connected to connection terminals of the first driving chip DC1, the first output pads F-PD1 connected to the display panel DP, and first input pads M-PD1 connected to the main circuit board MPCB.

The first substrate signal lines SL-1 connect the first connection pads CPD-1 and the first output pads F-PD1, and connect the first connection pads CPD-1 and the first input pads M-PD1. In another embodiment that the first driving chip DC1 is omitted, the first substrate signal lines SL-1 may connect the first output pads F-PD1 and the first input pads M-PD1 directly.

In an embodiment, the first flexible circuit board FPCB1 may be divided into a plurality of portions. For example, the portions are a first portion P1-1 in which the first input pads M-PD1 are disposed and which overlaps at least a portion of the main circuit board MPCB, a second portion P2-1 in which the first output pads F-PD1 are disposed and which overlaps at least a portion of the display panel DP, and a third portion P3-1 connecting the first portion P1-1 and the second portion P2-1.

The width of the second portion P2-1 in the first direction DR1 may be greater than the width of the first portion P1-1 in the first direction DR1. Therefore, at least one side of the third portion P3-1 of the major plane (i.e., plane defined by the first direction axis DR1 and the second direction axis DR2) may be inclined from the second portion P2-1 toward the first portion P1-1.

In the present embodiment, the first driving chip DC1 is shown as being disposed in the first portion P1-1, but is not limited thereto. In another embodiment, the first driving chip DC1 may be disposed in any one of the second portion P2-1 and the third portion P3-1.

The second flexible circuit board FPCB2 according to an embodiment includes a second upper surface F-U2 and a second lower surface F-B2 facing the second upper surface F-U2. The second upper surface F-U2 is shown in the plan view, and the second lower surface F-B2 is shown in the bottom view. The second flexible circuit board FPCB2 includes second substrate signal lines SL-2, a second driving chip DC2 disposed on the second lower surface F-B2, and a plurality of second substrate pads F-PD2, M-PD2, and CPD-2 exposed from the second lower surface F-B2.

The second substrate pads F-PD2, M-PD2, and CPD-2 may include the second connection pads CPD-2 connected to connection terminals of the second driving chip DC2, the second output pads F-PD2 connected to the display panel DP, and second input pads M-PD2 connected to the main circuit board MPCB.

The second substrate signal lines SL-2 connects the second connection pads CPD-2 and the second output pads F-PD2, and connects the second connection pads CPD-2 and the second input pads M-PD2. In another embodiment that the second driving chip DC2 is omitted, the second substrate signal lines SL-2 may connect the second output pads F-PD2 and the second input pads M-PD2 directly.

In an embodiment, the second flexible circuit board FPCB2 may be divided into a plurality of portions. For example, the portions are a first portion P1-2 in which the second input pads M-PD2 are disposed and which overlaps at least a portion of the main circuit board MPCB, a second portion P2-2 in which the second output pads F-PD2 is disposed and which overlaps at least a portion of the display panel DP, and a third portion P3-2 connecting the first portion P1-2 and the second portion P2-2.

The width of the second portion P2-2 in the first direction DR1 may be greater than the width of the first portion P1-2 in the first direction DR1. Therefore, at least one side of the first portion P1-2 of the major plane may be inclined from the second portion P2-2 toward the first portion P1-2.

In the present embodiment, the second driving chip DC2 is shown as being disposed in the first portion P1-2, but is not limited thereto. In another embodiment, the second driving chip DC2 may be disposed in any one of the second portion P2-2 and the third portion P3-2.

According to the inventive concept, the width of the first flexible circuit board FPCB1 in the second direction DR2 may be smaller than the width of the second flexible circuit board FPCB2 in the second direction DR2. That is, the sum of the widths of the first portion P1-1, the second portion P2-1, and the third portion P3-1 in the second direction DR2 of the first flexible circuit board FPCB1 is smaller than the sum of the widths of the first portion P1-2, the second portion P2-2, and the third portion P3-2 in the second direction DR2 of the second flexible circuit board FPCB2. Accordingly, as shown in FIG. 5A, the second portion P2-2 of the second flexible circuit board FPCB2 may cover at least a portion of the second portion P2-1 of the first flexible circuit board FPCB1. That is, the second flexible circuit board FPCB2 covers a side of the first flexible circuit board FPCB1 facing the display region DA.

Each of the flexible circuit boards FPCB1 and FPCB2 according to the inventive concept may have a different curvature when bent (see FIG. 1B) depending on a region. For example, the third portions P3-1 and P3-2 may have a relatively greater curvature than the first portions P1-1 and P1-2 and the second portion P2-1 and P2-2.

The first display substrate 100 shown in FIG. 6A and FIG. 6B is illustrated based on the liquid crystal display panel shown in FIG. 3A.

Referring to FIG. 6A, a first display pad PD1-P is connected to an auxiliary signal line PL-D through a first contact-hole CH-P1 passing through the first to fourth insulation layers 10 to 40. The first display pad PD1-P is exposed from the first to fourth insulation layers 10 to 40. When the first display pad PD1-P is omitted, an end portion of the auxiliary signal line PL-D may be exposed from the first to fourth insulation layers 10 to 40.

The first flexible circuit board FPCB1 is exemplarily illustrated as including a first insulation layer IL-1, a first substrate signal line SL-1, a first solder resist layer SR-1, and a first output pad F-PD1. The first solder resist layer SR-1 may define an opening exposing at least a portion of the first substrate signal line SL-1. The first output pad F-PD1 may be connected to the first substrate signal line SL-1 exposed by the opening of the first solder resist layer SR-1. The first output pad F-PD1 is electrically connected to the first display pad PD1-P through an anisotropic conductive film ACF.

Referring to FIG. 6B, a second display pad PD2-P is connected to the auxiliary signal line PL-D through a second contact-hole CH-P2 passing through the first to fourth insulation layers 10 to 40. The second display pad PD2-P is exposed from the first to fourth insulation layers 10 to 40. When the second display pad PD2-P is omitted, an end portion of the auxiliary signal line PL-D may be exposed from the first to fourth insulation layers 10 to 40.

The second flexible circuit board FPCB2 is exemplarily illustrated as including a second insulation layer IL-2, a second substrate signal line SL-2, a second solder resist layer SR-2, and a second output pad F-PD2. The second solder resist layer SR-2 may define an opening exposing at least a portion of the second substrate signal line SL-2. The second output pad F-PD2 may be connected to the second substrate signal line SL-2 exposed by the opening of the second solder resist layer SR-2. The second output pad F-PD2 is electrically connected to the second display pad PD1-2 through the anisotropic conductive film ACF.

Figure 7A:
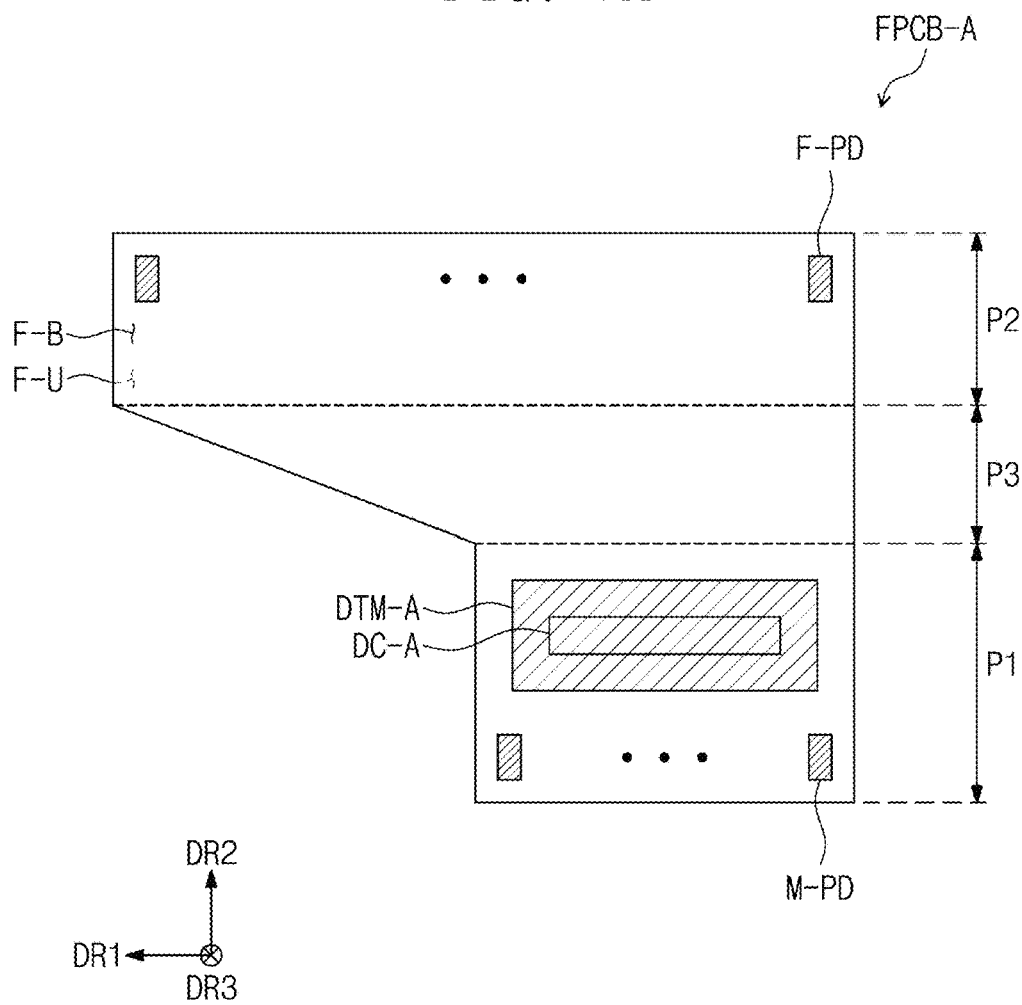
FIG. 7A is a bottom view of a flexible circuit board according to an embodiment of the inventive concept.
Figure 7B:
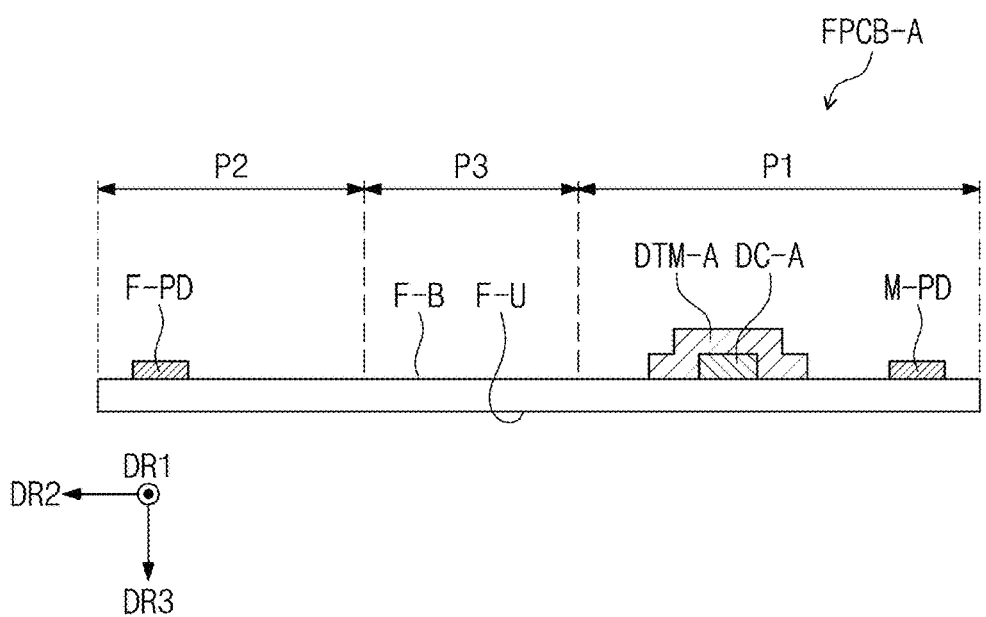
FIG. 7B is a cross-sectional view of a flexible circuit board of FIG. 7A.

FIG. 7A is a bottom view of a flexible circuit board according to an embodiment of the inventive concept. FIG. 7B is a cross-sectional view of a flexible circuit board of FIG. 7A. The same reference numerals are used for the same/similar components as those of FIG. 1A and FIG. 6B, and redundant descriptions thereof are omitted.

Referring to FIG. 7A and FIG. 7B, a flexible circuit board FPCB-A according to an embodiment includes an upper surface F-U and a lower surface F-B, and may be divided into a first portion P1, a second portion P2, and a third portion P3 connecting the first portion P1 and the second portion P2. The upper surface F-U is shown in the plan view, and the lower surface F-B is shown in the bottom view. The flexible circuit board FPCB-A includes substrate pads F-PD and M-PD and a driving chip DC-A. Signal lines connected to the substrate pads F-PD and M-PD and the driving chip DC-A are omitted in the drawing.

The substrate pads F-PD and M-PD may be exposed by the lower surface F-B of the flexible circuit board FPCB-A. Referring to FIG. 4A, the first portion P1 in which the input pads M-PD of the substrate pads F-PD and M-PD are disposed overlaps at least a portion of the main circuit board MPCB. The second portion P2 in which the output pads F-PD of the substrate pads F-PD and M-PD are disposed overlaps at least a portion of the display panel DP. The third portion P3 connects the first portion P1 and the second portion P2, and when the flexible circuit board FPCB-A is bent (see FIG. 1B), the third portion P3 may have a relatively greater curvature than each of the first portion P1 and the second portion P2.

The driving chip DC-A may be disposed on the same surface with the substrate pads F-PD and M-PD. For example, the driving chip DC-A may be disposed on the lower surface F-B of the flexible circuit board FPCB-A. In addition, the driving chip DC-A may be disposed in the first portion P1 of the lower surface F-B.

According to the present embodiment, a protective member DTM-A may cover the driving chip DC-A. Accordingly, the protective member DTM-A may cover a portion of the first portion P1 of the lower surface F-B. When the flexible circuit board FPCB-A is bent, the first portion P1 on which the driving chip DC-A may be disposed may have a relatively small curvature, and since the protective member DTM-A covers the driving chip DC-A, damage to the driving chip DC-A may be reduced to a minimum. Accordingly, the display apparatus DD with improved reliability may be provided.

Although not shown, according to another embodiment, a driving chip DC-A may be disposed in the second portion P2, and in this case, the protective member DTM-A may be disposed in the second portion P2 to cover the driving chip DC-A. However, the inventive concept is not limited to any one embodiment.

Figure 8A:
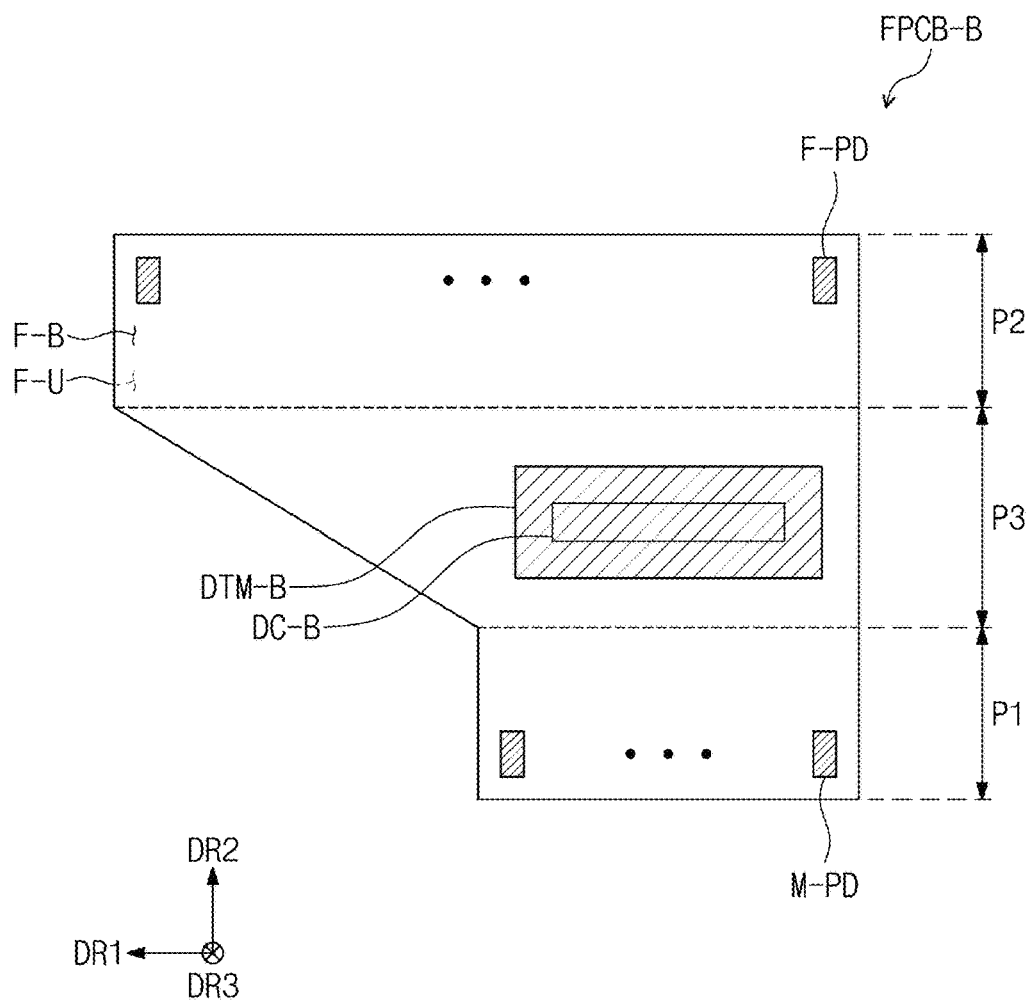
FIG. 8A is a bottom view of a flexible circuit board according to an embodiment of the inventive concept.
Figure 8B:
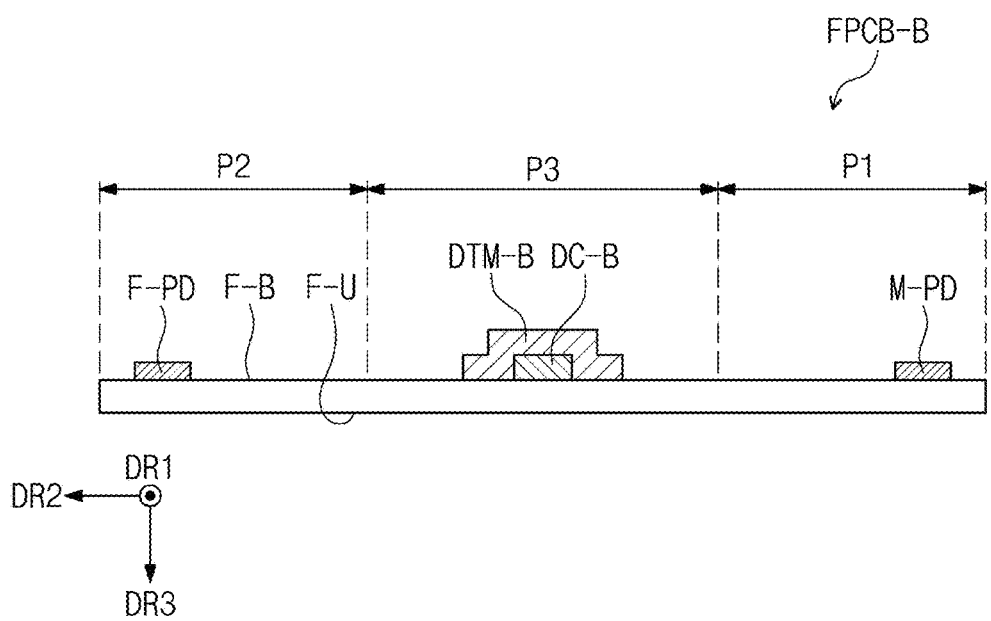
FIG. 8B is a cross-sectional view of a flexible circuit board of FIG. 8A.

FIG. 8A is a bottom view of a flexible circuit board according to an embodiment of the inventive concept. FIG. 8B is a cross-sectional view of a flexible circuit board of FIG. 8A. The same reference numerals are used for the same/similar components as those of FIG. 1A and FIG. 6B, and redundant descriptions thereof are omitted.

Referring to FIG. 8A and FIG. 8B, a flexible circuit board FPCB-B according to an embodiment includes the upper surface F-U and the lower surface F-B, and may be divided into the first portion P1, the second portion P2, and the third portion P3 connecting the first portion P1 and the second portion P2. The upper surface F-U is shown in the plan view, and the lower surface F-B is shown in the bottom view. The flexible circuit board FPCB-B includes the substrate pads F-PD and M-PD and a driving chip DC-B. Signal lines connected to the substrate pads F-PD and M-PD and the driving chip DC-B are omitted in the drawing.

The substrate pads F-PD and M-PD may be exposed by the lower surface F-B of the flexible circuit board FPCB-B. Referring to FIG. 4A, the first portion P1 in which the input pads M-PD of the substrate pads F-PD and M-PD are disposed overlaps at least a portion of the main circuit board MPCB. The second portion P2 in which the output pads F-PD of the substrate pads F-PD and M-PD are disposed overlaps at least a portion of the display panel DP. The third portion P3 connects the first portion P1 and the second portion P2, and when the flexible circuit board FPCB-B is bent (see FIG. 1B), the third portion P3 may have a relatively greater curvature than each of the first portion P1 and the second portion P2.

The driving chip DC-B may be disposed on the same surface with the substrate pads F-PD and M-PD. For example, the driving chip DC-B may be disposed on the lower surface F-B of the flexible circuit board FPCB-B. In addition, the driving chip DC-B may be disposed in the third portion P3 of the lower surface F-B.

According to the present embodiment, a protective member DTM-B may cover the driving chip DC-B. Accordingly, the protective member DTM-B may cover a portion of the third portion P3 of the lower surface F-B. When the flexible circuit board FPCB-B is bent, the third portion P3 on which the driving chip DC-B may be disposed may have a relatively greater curvature. According to the inventive concept, even when the driving chip CD-B is disposed in the third portion P3 to which stress is applied to the maximum when the flexible circuit board FPCB-B is bent, since the protective member DTM-B for covering the driving chip DC-B is included, damage to the driving chip DC-B may be reduced to a minimum. Accordingly, the display apparatus DD with improved reliability may be provided.

Figure 9A:
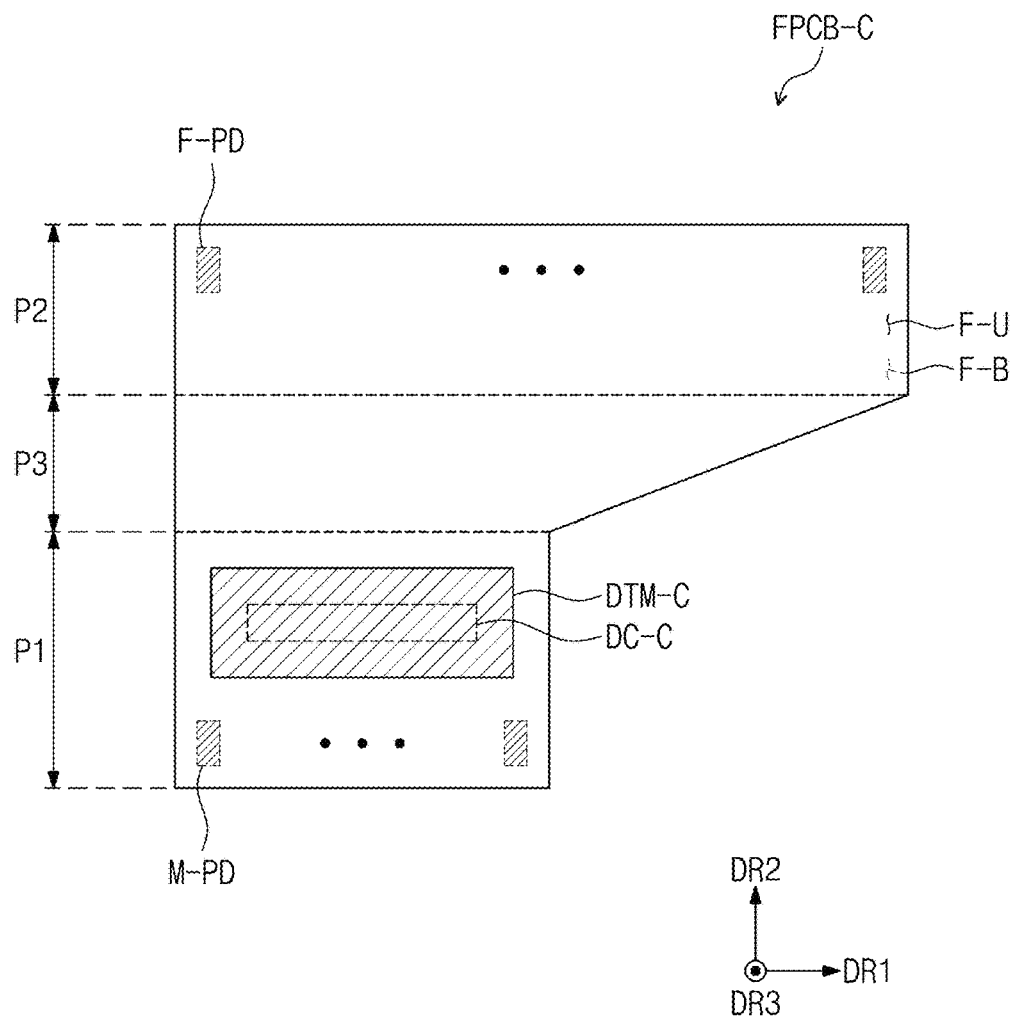
FIG. 9A is a plan view of a flexible circuit board according to an embodiment of the inventive concept.
Figure 9B:
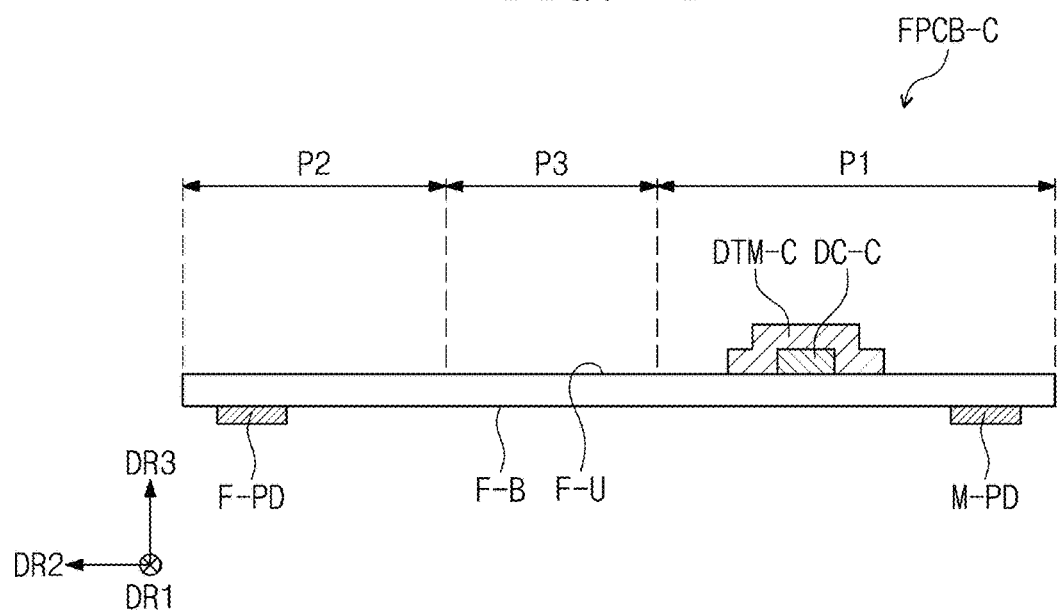
FIG. 9B is a cross-sectional view of a flexible circuit board of FIG. 9A.

FIG. 9A is a plan view of a flexible circuit board according to an embodiment of the inventive concept. FIG. 9B is a cross-sectional view of a flexible circuit board of FIG. 9A. The same reference numerals are used for the same/similar components as those of FIG. 1A and FIG. 6B, and redundant descriptions thereof are omitted.

Referring to FIG. 9A and FIG. 9B, a flexible circuit board FPCB-C according to an embodiment includes the upper surface F-U and the lower surface F-B, and may be divided into the first portion P1, the second portion P2, and the third portion P3 connecting the first portion P1 and the second portion P2. The upper surface F-U is shown in the plan view, and the lower surface F-B is shown in the bottom view. The flexible circuit board FPCB-C includes the substrate pads F-PD and M-PD and a driving chip DC-C.

The substrate pads F-PD and M-PD may be exposed by the lower surface F-B of the flexible circuit board FPCB-C. Referring to FIG. 4A, the first portion P1 in which the input pads M-PD of the substrate pads F-PD and M-PD are disposed overlaps at least a portion of the main circuit board MPCB. The second portion P2 in which the output pads F-PD of the substrate pads F-PD and M-PD are disposed overlaps at least a portion of the display panel DP. The third portion P3 connects the first portion P1 and the second portion P2, and when the flexible circuit board FPCB-C is bent (see FIG. 1B), the third portion P3 may have a relatively greater curvature than each of the first portion P1 and the second portion P2.

The driving chip DC-C may be disposed on a different surface from a surface on which the substrate pads F-PD and M-PD are exposed. For example, the driving chip DC-C may be disposed on the upper surface F-U of the flexible circuit board FPCB-C. In addition, the driving chip DC-A may be disposed in the first portion P1 of the upper surface F-U.

According to the present embodiment, a protective member DTM-C may cover the driving chip DC-C. Accordingly, the protective member DTM-C may cover a portion of the first portion P1 of the upper surface F-U. When the flexible circuit board FPCB-C is bent so that the lower surface F-B is disposed inside the curvature, the upper surface F-U may have relatively greater tensile stress than the lower surface F-B.

According to the inventive concept, even when a driving chip DC-C is disposed on the upper surface F-U to which tensile stress is applied to the maximum when the flexible circuit board FPCB-C is bent, since the protective member DTM-C for covering the driving chip DC-C is included, damage to the driving chip DC-C may be reduced to a minimum. Accordingly, the display apparatus DD with improved reliability may be provided.

Figure 10:
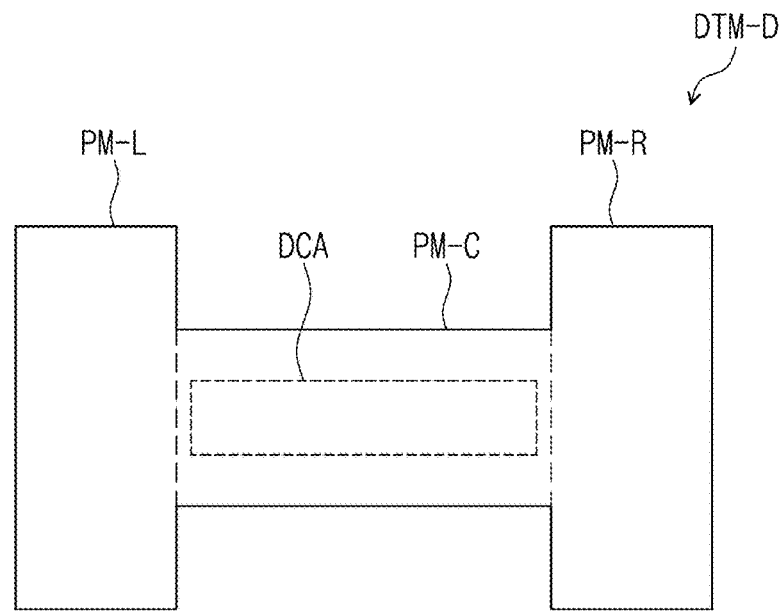
FIG. 10 is a plan view of a protective member according to an embodiment of the inventive concept.
Figure 10:
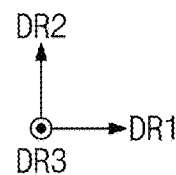
Figure 11:
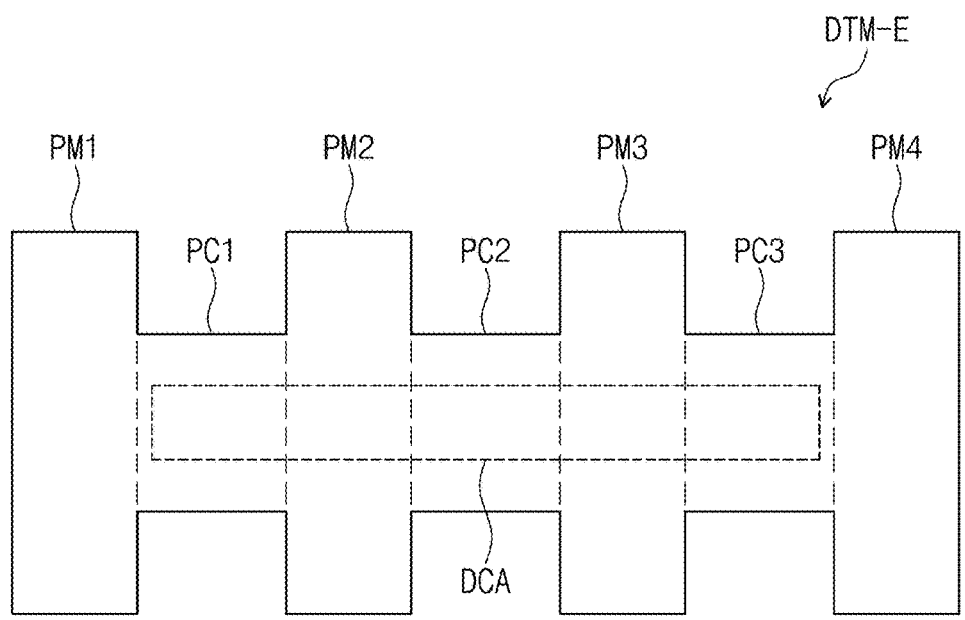
FIG. 11 is a plan view of a protective member according to another embodiment of the inventive concept.
Figure 11:
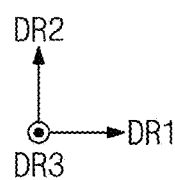

FIG. 10 is a plan view of a protective member according to an embodiment of the inventive concept. FIG. 11 is a plan view of a protective member according to another embodiment of the inventive concept. The same reference numerals are used for the same/similar components as those of FIG. 1A and FIG. 6B, and redundant descriptions thereof are omitted.

Referring to FIG. 10, a protective member DTM-D according to an embodiment may include a first extension pattern PM-L, a second extension pattern PM-R, and a connection pattern PM-C. The connection pattern PM-C is disposed between the first extension pattern PM-L and the second extension pattern PM-R to connect the first extension pattern PM-L and the second extension pattern PM-R.

The first extension pattern PM-L and the second extension pattern PM-R are spaced apart from each other along the first direction DR1 and extended along the second direction DR2. The connection pattern PM-C may be extended along the first direction DR1. In the plan view, an anti-deformation member DDTM-D may have an 'H' shape.

In FIG. 10, a chip region DCA in which the driving chips DC1 and DC2 (see FIG. 1A) are disposed is illustrated with a dotted line. According to the present embodiment, the connection pattern PM-C may overlap the chip region DCA. Accordingly, the connection pattern PM-C may cover the driving chips in the chip region DCA.

Referring to FIG. 11, a protective member DTM-E according to an embodiment may include a plurality of extension patterns PM1, PM2, PM3, and PM4 and a plurality of connection patterns PC1, PC2, and PC3.

The extension patterns PM1, PM2, PM3, and PM4 are spaced apart from each other along the first direction DR1 and extended along the second direction DR2. The connection patterns are disposed between corresponding extension patterns PM1, PM2, PM3, and PM4 and connect the extension patterns PM1, PM2, PM3, and PM4.

In FIG. 11, the chip region DCA in which the driving chips DC1 and DC2 (see FIG. 1A) are disposed is illustrated with a dotted line. According to the present embodiment, extension patterns PM2 and PM3 and the connection patterns PC1, PC2, and PC3 may overlap the chip region DCA. Accordingly, extension patterns PM2 and PM3 and the connection patterns PC1, PC2, and PC3 may cover the driving chips in the chip region DCA.

A display apparatus according to the inventive concept includes a protective member for covering a driving chip mounted on a flexible circuit board, and thus, may prevent damage to the driving chip caused by stress occurring when the flexible circuit board is bent. In addition, external impact may be mitigated, and foreign matters may be prevented from entering.

Accordingly, the display apparatus with improved reliability may be provided.

Although the inventive concept has been described with reference to a preferred embodiment of the inventive concept, it will be understood by those skilled in the art that various changes in form and details may be made therein without departing from the spirit and scope of the inventive concept.

Accordingly, the technical scope of the inventive concept is not intended to be limited to the contents set forth in the detailed description of the specification, but is intended to be defined by the appended claims.

What is claimed is:

1. A display apparatus comprising:
 a display panel which includes first display pads arranged in a first direction;
 a main circuit board;
 a first flexible circuit board which includes first substrate pads connected to the main circuit board and the first display pads and a first driving chip connected to the first substrate pads, and is bent in a direction toward a back surface of the display panel; and
 a protective member disposed on the first flexible circuit board, wherein the protective member comprises a first extension pattern and a second extension pattern which are spaced apart from each other along the first direction and extended along a second direction crossing the first direction, and a connection pattern which connects the first extension pattern and the second extension pattern and is extended along the first direction,
 wherein the connection pattern covers the first driving chip.

2. The display apparatus of claim 1, wherein the first flexible circuit board comprises a lower surface from which the first substrate pads are exposed and an upper surface facing the lower surface,
 wherein the lower surface faces the back surface of the display panel when the first flexible circuit board is bent.

3. The display apparatus of claim 2, wherein:
 the first driving chip is mounted on the lower surface; and
 the protective member covers the first driving chip and a portion of the lower surface.

4. The display apparatus of claim 2, wherein:
 the first driving chip is mounted on the upper surface; and
 the protective member covers the first driving chip and a portion of the upper surface.

5. The display apparatus of claim 1, wherein the first flexible circuit board further comprises:
 a first portion which overlaps at least a portion of the main circuit board;

a second portion which overlaps at least a portion of the display panel; and a third portion which connects the first portion and the second portion, wherein when the first flexible circuit board is bent, the third portion has a relatively greater curvature than each of the first portion and the second portion.

6. The display apparatus of claim 5, wherein the first driving chip is disposed on the first portion, and the protective member covers the first driving chip.

7. The display apparatus of claim 5, wherein:
the first driving chip is disposed on the third portion; and
the protective member covers the first driving chip.

8. The display apparatus of claim 1, wherein:
the display panel further comprises second display pads disposed spaced apart from the first display pads in a second direction crossing the first direction and arranged in the first direction; and the display apparatus further comprises a second flexible circuit board which includes second substrate pads connected to the main circuit board and the second display pads and a second driving chip connected to the second substrate pads, and is bent in the direction toward the back surface of the display panel, wherein a portion of the second flexible circuit board covers a portion of the first flexible circuit board.

9. The display apparatus of claim 8, wherein the protective member is provided in plurality, and one of the protective members covers the second driving chip.

10. The display apparatus of claim 1, wherein each of the first extension pattern and the second extension pattern is provided in plurality, the plurality of first extension patterns and the plurality of second extension patterns are alternately disposed along the first direction, the connection pattern is provided in plurality, and each of the plurality of connection patterns is disposed between corresponding first extension pattern and corresponding second extension pattern.

11. The display apparatus of claim 1, wherein the protective member is provided as either a resin or a double-sided tape.

12. A display apparatus comprising:
a display panel which includes first display pads arranged in a first direction and second display pads disposed spaced apart from the first display pads in a second direction crossing the first direction and arranged in the first direction;
a main circuit board;
a first flexible circuit board which includes first substrate pads connected to the main circuit board and the first display pads, and a first driving chip connected to the first substrate pads;
a second flexible circuit board which includes second substrate pads connected to the main circuit board and the second display pads, and a second driving chip connected to the second substrate pads; and
protective members which includes a first protective member disposed on the first flexible circuit board and a second protective member disposed on the second flexible circuit board,
wherein the first flexible circuit board and the second flexible circuit board are bent in a direction toward a back surface of the display panel, and
wherein each of the first protective member and the second protective member comprises a first extension pattern and a second extension pattern which are spaced apart from each other along the first direction and extended along a second direction crossing the first direction, and a connection pattern which connects the first extension pattern and the second extension pattern and is extended along the first direction,
wherein the connection pattern of the first protective member covers the first driving chip and the connection pattern of the second protective member covers the second driving chip.

13. The display apparatus of claim 12, wherein each of the first flexible circuit board and the second flexible circuit board comprises a lower surface and an upper surface facing the lower surface,
wherein the lower surface faces the back surface of the display panel when the first flexible circuit board and the second flexible circuit board are bent.

14. The display apparatus of claim 13, wherein:
the first driving chip and the second driving chip are mounted on the lower surface of the first flexible circuit board and the lower surface of the second flexible circuit board, respectively;
the first protective member covers the first driving chip and a portion of the lower surface of the first flexible circuit board; and
the second protective member covers the second driving chip and a portion of the lower surface of the second flexible circuit board.

15. The display apparatus of claim 12, wherein each of the first flexible circuit board and the second flexible circuit board further comprises:
a first portion which overlaps at least a portion of the main circuit board;
a second portion which overlaps at least a portion of the display panel; and
a third portion which connects the first portion and the second portion,
wherein when the first flexible circuit board and the second flexible circuit board are bent, the third portion has a relatively greater curvature than each of the first portion and the second portion.

16. The display apparatus of claim 15, wherein:
the first driving chip is disposed in the first portion of the first flexible circuit board, and the first protective member covers the first driving chip; and
the second driving chip is disposed in the first portion of the second flexible circuit board, and the second protective member covers the second driving chip.

17. The display apparatus of claim 15, wherein:
the first driving chip is disposed in the third portion of the first flexible circuit board, and the first protective member covers the first driving chip; and
the second driving chip is disposed in the third portion of the second flexible circuit board, and the second protective member covers the second driving chip.

18. The display apparatus of claim 15, wherein a sum of widths of the first portion, the second portion, and the third portion of the first flexible circuit board in the second direction is smaller than a sum of widths of the first portion, the second portion, and the third portion of the second flexible circuit board in the second direction.

19. The display apparatus of claim 12, wherein each of the first flexible circuit board and the second flexible circuit board further comprises:
an insulation layer;
a plurality of substrate signal lines disposed on the insulation layer;
a solder resist layer which defines an opening which exposes at least one of the substrate signal lines; and a plurality of substrate pads connected to the at least one of the substrate signal lines exposed through the opening, wherein each of the substrate pads is connected to corresponding one of the first display pads and the second display pads by an anisotropic conductive film.

\* \* \* \* \*